US010389963B2

(12) United States Patent
Hisamatsu

(10) Patent No.: US 10,389,963 B2
(45) Date of Patent: Aug. 20, 2019

(54) IMAGE PICKUP DEVICE AND ELECTRONIC APPARATUS

(71) Applicant: SONY SEMICONDUCTOR SOLUTIONS CORPORATION, Kanagawa (JP)

(72) Inventor: Yasuaki Hisamatsu, Fukuoka (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/743,070

(22) PCT Filed: Jul. 8, 2016

(86) PCT No.: PCT/JP2016/070260
§ 371 (c)(1),
(2) Date: Jan. 9, 2018

(87) PCT Pub. No.: WO2017/014070
PCT Pub. Date: Jan. 26, 2017

(65) Prior Publication Data
US 2019/0082126 A1    Mar. 14, 2019

(30) Foreign Application Priority Data

Jul. 22, 2015  (JP) .................. 2015-144836

(51) Int. Cl.
*H03M 1/46* (2006.01)
*H03M 1/56* (2006.01)
(Continued)

(52) U.S. Cl.
CPC .......... *H04N 5/378* (2013.01); *H03M 1/0612* (2013.01); *H03M 1/46* (2013.01);
(Continued)

(58) Field of Classification Search
CPC ........ H04N 5/357–3675; H04N 5/374–37457; H04N 5/378; H03M 1/34–468; H03M 1/66–88; H01L 27/146–14698
See application file for complete search history.

(56) References Cited

U.S. PATENT DOCUMENTS

2009/0033759 A1    2/2009  Wakabayashi
2011/0050967 A1*   3/2011  Matsumoto ........... H03M 1/745
                                                        348/294

(Continued)

FOREIGN PATENT DOCUMENTS

JP    2009-038772 A    2/2009
JP    2011-259407 A    12/2011
JP    2014-120860 A    6/2014

OTHER PUBLICATIONS

International Search Report and Written Opinion of PCT Application No. PCT/JP2016/070260, dated Aug. 16, 2016, 09 pages of ISRWO.

*Primary Examiner* — Paul M Berardesca
(74) *Attorney, Agent, or Firm* — Chip Law Group

(57) ABSTRACT

The present technology relates to an image pickup device and an electronic apparatus capable of preventing degradation of the picture quality. A plurality of current sources can be selectively connected to an output terminal for outputting a reference signal having a level that varies, and a plurality of terminating resistors are connected to the output terminal. The terminating resistors that are to supply current of current sources that are connected to the output terminal are connected by a plurality of switches, and current of current sources that are not connected to the output terminal is supplied to the switches. The present technology can be applied, for example, to image pickup devices that perform AD conversion using a reference signal and so forth.

6 Claims, 13 Drawing Sheets

(51) Int. Cl.
*H04N 5/355* (2011.01)
*H04N 5/357* (2011.01)
*H04N 5/374* (2011.01)
*H04N 5/378* (2011.01)
*H03M 1/06* (2006.01)

(52) U.S. Cl.
CPC .............. *H03M 1/56* (2013.01); *H04N 5/355* (2013.01); *H04N 5/357* (2013.01); *H04N 5/374* (2013.01)

(56) References Cited

U.S. PATENT DOCUMENTS

2011/0279723 A1 11/2011 Takamiya et al.
2014/0166856 A1 6/2014 Kato et al.
2017/0230599 A1* 8/2017 Abiru .................. H04N 5/378

* cited by examiner

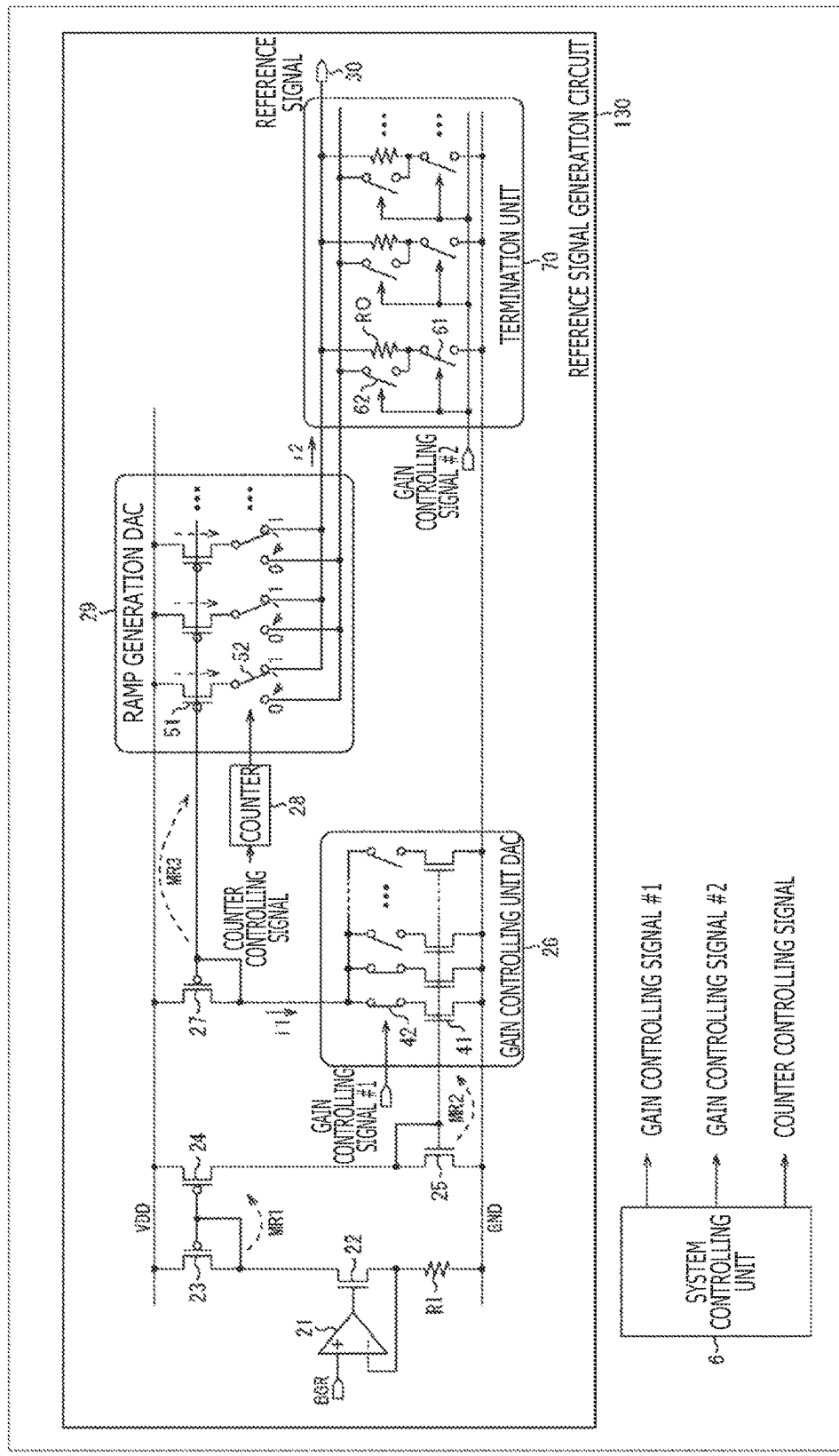
F I G . 9

IMAGE PICKUP DEVICE AND ELECTRONIC APPARATUS

CROSS REFERENCNE TO RELATED APPLICATIONS

This application is a U.S. National Phase of International Patent Application No. PCT./JP2016/070260 file on Jul. 8, 2016, which claims priority benefit of Japanese Patent Application No. JP 2015-144836 filed in the Japan Patent Office on Jul. 22, 2015. Each of the above-referenced applications is hereby incorporated herein by reference in its entirety.

TECHNICAL FIELD

The present technology relates to an image pickup device and an electronic apparatus, and particularly to an image pickup device and an electronic apparatus capable of preventing, for example, degradation of the picture quality.

BACKGROUND ART

In recent years, a CMOS (Complementary Metal Oxide Semiconductor) image sensor is widely used as a (solid-state) image pickup device from the point of view of the cost and so forth.

In the CMOS image sensor, a slope type AD conversion circuit is widely utilized for AD (Analog to Digital) conversion of an electric signal outputted from a pixel (hereinafter referred to also as pixel signal). In the slope type AD conversion circuit, a ramp signal is used as a reference signal (voltage) and the reference signal and the pixel signal are compared with each other by a comparator, and a time period before an output of the comparator reverses is counted by a counter to perform AD conversion of the pixel signal (for example, refer to PTL 1).

According to the slope type AD conversion circuit, a column AD conversion circuit can be configured in which, for example, a slope type AD conversion circuit is arrayed for each pixel column and the AD conversion is performed at the same time for all columns.

CITATION LIST

Patent Literature

[PTL 1]
JP 2014-120860A

SUMMARY

Technical Problem

Where a ramp signal used as the reference signal in the slope type AD conversion circuit disperses, a pixel value obtained by AD conversion performed using the reference signal is dispersed and hence the picture quality of an image obtained by an image pickup device is degraded.

The present technology has been made in view of such a situation as described above, and it is an object of the present technology to make it possible to prevent degradation of the picture quality.

Solution to Problem

The image pickup device of the present technology is an image pickup device including a pixel having a photoelectric conversion device that performs photoelectric conversion and configured to output an electric signal, a reference signal generation unit configured to generate a reference signal having a level that varies, a comparison unit configured to compare the electric signal and the reference signal with each other, and a counting unit configured to perform AD (Analog to Digital) conversion of the electric signal by performing counting of a count value in response to a result of the comparison between the electric signal and the reference signal. The reference signal generation unit includes a plurality of current sources whose connection to an output terminal for outputting the reference signal is selectable, a plurality of terminating resistors connected to the output terminal, and a plurality of switches configured to select the terminating resistors that are to supply current of the current sources that are connected to the output terminal, and is configured so as to supply current of the current sources that are not connected to the output terminal to the switches.

The electronic apparatus of the present technology is an electronic apparatus including an optical system configured to collect light, and an image pickup device configured to receive the light to pick up an image. The image pickup device includes a pixel having a photoelectric conversion device that performs photoelectric conversion and configured to output an electric signal, a reference signal generation unit configured to generate a reference signal having a level that varies, a comparison unit configured to compare the electric signal and the reference signal with each other, and a counting unit configured to perform AD (Analog to Digital) conversion of the electric signal by performing counting of a count value in response to a result of the comparison between the electric signal and the reference signal. The reference signal generation unit includes a plurality of current sources whose connection to an output terminal for outputting the reference signal is selectable, a plurality of terminating resistors connected to the output terminal, and a plurality of switches configured to select the terminating resistors that are to supply current of the current sources that are connected to the output terminal, and is configured so as to supply current of the current sources that are not connected to the output terminal to the switches.

In the image pickup device and the electronic apparatus of the present technology, a reference signal is generated, and an electric signal outputted from the pixel and the reference signal are compared with each other. Then, in response to a result of the comparison between the electric signal and the reference signal, counting of a count value is performed to perform AD conversion of the electric signal. The reference signal is generated by supply of current of the plurality of current sources, whose connection to the output terminal for outputting the reference signal is selectable, to the terminating resistors connected to the output terminal. The terminating resistors to which current of the current sources connected to the output terminal is to be supplied are selected by switches. To the switches, current of the current sources that are not connected to the output terminal is supplied.

It is to be noted that the image pickup device may be an independent device or may be an internal block configuring one apparatus.

Advantageous Effect of Invention

With the present technology, degradation of the picture quality can be prevented.

It is to be noted that the effect described here is not necessarily restrictive and may be any of the effects described in the present disclosure.

BRIEF DESCRIPTION OF DRAWINGS

FIG. 9 is a circuit diagram depicting a third example of a configuration of the reference signal generation circuit 130.

DESCRIPTION OF EMBODIMENT

<One Embodiment of Image Pickup Device to which the Present Technology is Applied>

Figure 1:
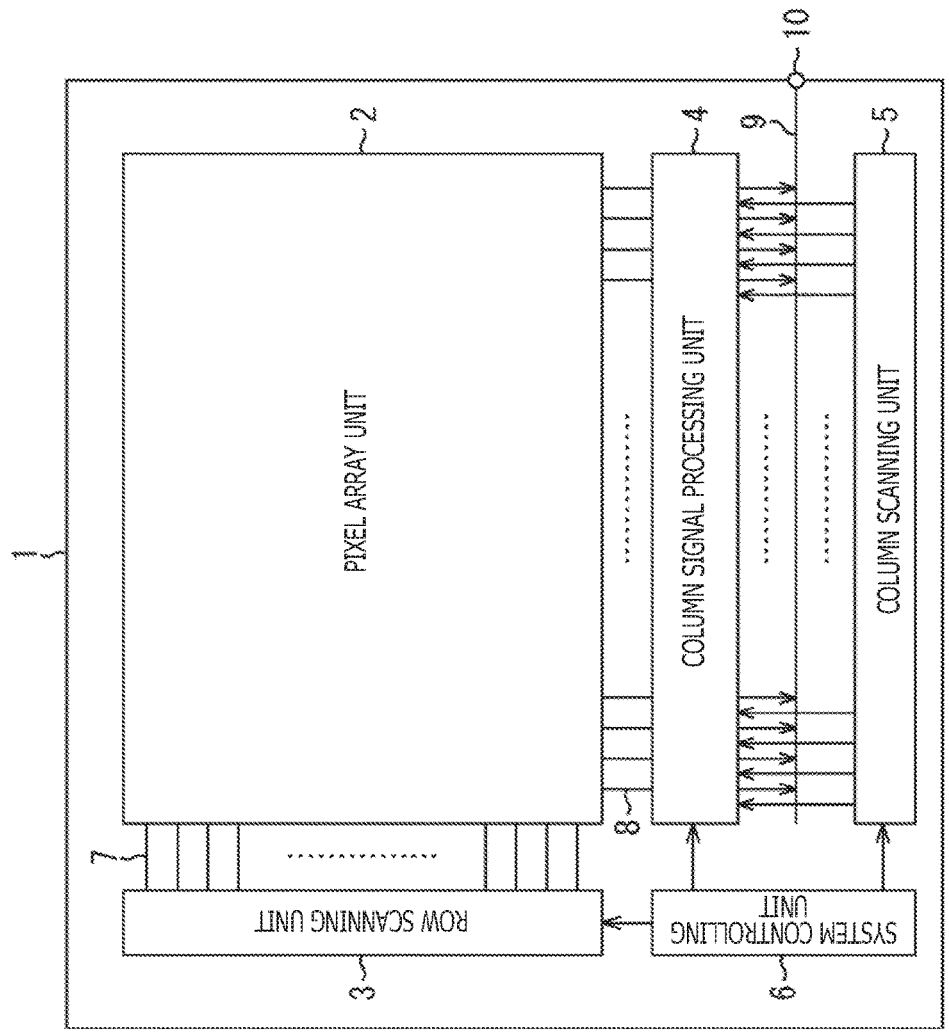
FIG. 1 is a block diagram depicting an example of a configuration of an embodiment of an image pickup device to which the present technology is applied.

FIG. 1 is a block diagram depicting an example of a configuration of an embodiment of an image pickup device to which the present technology is applied.

In FIG. 1, the image pickup device includes a semiconductor substrate 1, a pixel array unit 2, a row scanning unit 3, a column signal processing unit 4, a column scanning unit 5, a system controlling unit 6, pixel driving lines 7, VSLs (Vertical Signal Lines) (vertical signal lines) 8, a transfer line 9, and an output terminal 10.

The components from the pixel array unit 2 to the output terminal 10 are formed on the semiconductor substrate 1.

For example, hereinafter described, the pixel array unit 2 is configured by arraying pixels 110 (FIG. 2), which perform photoelectric conversion, in a two-dimensional matrix by H×V horizontally and vertically.

The pixel array unit 2 outputs a pixel signal obtained by photoelectric conversion by each pixel 110 to a VSL 8 under the control of the row scanning unit 3.

The row scanning unit 3 controls (drives) the pixels 110 connected to the pixel driving lines 7 through the pixel driving lines 7 under the control of the system controlling unit 6. Here, one or more pixel driving lines 7 are arrayed for each row of the pixels 110.

The column signal processing unit 4 is connected, for example, to H pixels 110 arrayed in each row through H VSLs 8 such that pixel signals that are electric signals (voltages) outputted from the pixels 110 to the VSLs 8 are supplied as voltages of the VSLs 8 (VSL voltages).

The column signal processing unit 4 performs AD conversion of VSL voltages (pixel signals), which are supplied through the VSLs 8 from the H pixels 110 arrayed in each row, in parallel under the control of the system controlling unit 6. Further, the column signal processing unit 4 outputs digital data obtained as a result of the AD conversion of the VSL voltages as pixel values (pixel data) of the pixels 110 to the transfer line 9 under the control of the column scanning unit 5. The pixel values outputted to the transfer line 9 are transferred to the output terminal 10 and outputted to the outside.

Here, the column signal processing unit 4 can perform AD conversion of the pixel signals of all of H pixels 110 arrayed on one row in parallel and further can perform AD conversion of pixel signals of a plural number of pixels smaller than H from the H pixels 110 in parallel.

However, in the following description, in order to simplify the description, it is assumed that the column signal processing unit 4 performs AD conversion of the VSL voltage of all of the H pixels 110 arrayed in one column in parallel.

The column scanning unit 5 controls the column signal processing unit 4 to output a result of the AD conversion of the VSL voltages (pixel signals) to the transfer line 9 under the control of the system controlling unit 6.

The system controlling unit 6 controls the row scanning unit 3, the column signal processing unit 4, and the column scanning unit 5.

In the image pickup device configured in such a manner as described above, each pixel 110 (FIG. 2) in the pixel array unit 2 performs photoelectric conversion of light incident thereto. Pixel signals that are electric signals obtained as a result of the photoelectric conversion by the pixels 110 are outputted from each H pixels 110 in one row beginning with the pixels 110 in the first row to the VSLs 8 under the control of the row scanning unit 3 through the pixel driving lines 7.

The VSL voltages on the VSLs 8 obtained from the pixel signals outputted to the VSLs 8 are AD converted in column parallel for each row by the column signal processing unit 4 under the control of the system controlling unit 6, and pixel values that are a result of the AD conversion are outputted from the output terminal 10 through the transfer line 9.

<Example of Configuration of Pixel Array Unit 2 and Example of Configuration of Column Signal Processing Unit 4>

Figure 2:
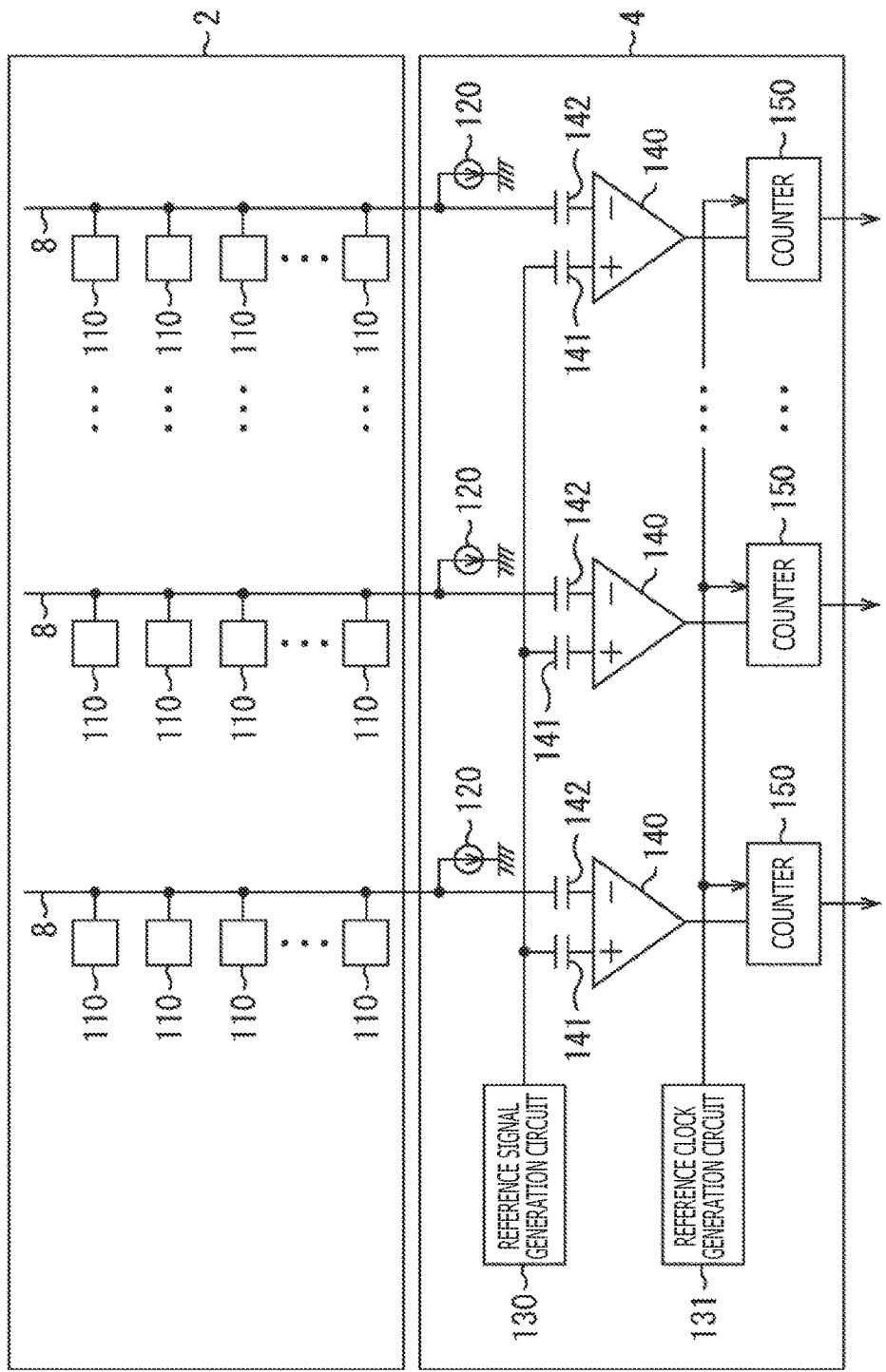
FIG. 2 is a block diagram depicting an example of a configuration of a pixel array unit 2 and an example of a configuration of a column signal processing unit 4.

FIG. 2 is a block diagram depicting an example of a configuration of the pixel array unit 2 and an example of a configuration of the column signal processing unit 4.

The pixel array unit 2 has a plurality of pixels 110 that perform photoelectric conversion. In the pixel array unit 2, the plurality of pixels 110 are arrayed in a two-dimensional matrix by H×V horizontally and vertically.

The VSLs 8 are wired, for example, for each column of the pixels 110, and each pixel 110 outputs a pixel signal obtained as a result of the photoelectric conversion to a VSL 8.

The pixel signal outputted from the pixel 110 to the VSL 8 is supplied as a VSL voltage to the column signal processing unit 4.

The column signal processing unit 4 includes, for example, H bias circuits 120, comparators 140, and counters 150 equal to the number of VSLs 8, a reference signal generation circuit 130 and a reference clock generation circuit 131 and configures a column AD conversion circuit.

Each bias circuit 120 is a current source and supplies current to a VSL 8 to control the VSL 8 to a predetermined voltage.

The reference signal generation circuit 130 is configured, for example, from a DAC (Digital to Analog Converter), and generates a ramp (ramp) signal whose level (voltage) varies from a predetermined initial value to a predetermined final value in a fixed inclination as a reference signal to be used for AD conversion and supplies the ramp signal to one of two input terminals of H comparators 140.

The reference clock generation circuit 131 generates a reference clock that is a clock used by a counter 150 to count a count value and supplies the reference clock to the H counters 150.

Each comparator 140 is connected at the other input terminal thereof to a VSL 8. Accordingly, a VSL voltage (pixel signal) is supplied to the other input terminal of the comparator 140 through the VSL 8.

Here, capacitors 141 and 142 are individually connected to the two input terminals of the comparator 140. A reference signal from the reference signal generation circuit 130 is supplied to the comparator 140 through the capacitor 141, and a VSL voltage from the VSL 8 is supplied to the comparator 140 through the capacitor 142.

The comparator 140 compares the reference signal and the VSL voltage supplied to the two input terminals thereof with each other, and outputs a result of the comparison as a comparator output.

Here, where the reference signal is higher than the VSL voltage (or the reference signal is equal to or higher than the VSL voltage), the comparator 140 outputs, for example, an H level from between an H (High) level and an L (Low) level as a comparator output. Further, where the reference signal is not higher than the VSL voltage, the comparator 140 inverts the comparator output and outputs the L level.

The comparator output is supplied from the comparator 140 to the counter 150.

The counter 150 performs counting of a count value in synchronism with a reference clock supplied thereto from the reference clock generation circuit 131.

In the counter 150, counting of the count value is performed in response to the comparator output from the comparator 140.

In particular, the counter 150 performs counting of the count value, for example, when the comparator output exhibits the H level, and stops the counting when the level of the comparator output is inverted to the L level.

The counter 150 counts the time required for variation of the level of the reference signal before the VSL voltage and the reference signal (voltage) become coincident with each other (before the relationship in magnitude between the VSL voltage and the reference signal is reversed) in such a manner as described above to perform AD conversion of the VSL voltage (pixel signal).

The counter 150 outputs its count value, namely, a result of the AD conversion of the VSL voltage (pixel signal) as a pixel value to the transfer line 9 (FIG. 1).

In the column signal processing unit 4 of FIG. 2, one set of a comparator 140 and a counter 150 configures one slope type AD conversion circuit together with the reference signal generation circuit 130 and the reference clock generation circuit 131.

It is to be noted that, while, in FIG. 2, one set of a comparator 140 and a counter 150, which is one slope type AD conversion circuit, is provided for each one column (of the pixels 110), the set of a comparator 140 and a counter 150 can be provided for each of a plurality of columns such that AD conversion of the plurality of columns is performed time-divisionally.

<Example of Configuration of Pixel 110>

Figure 3:
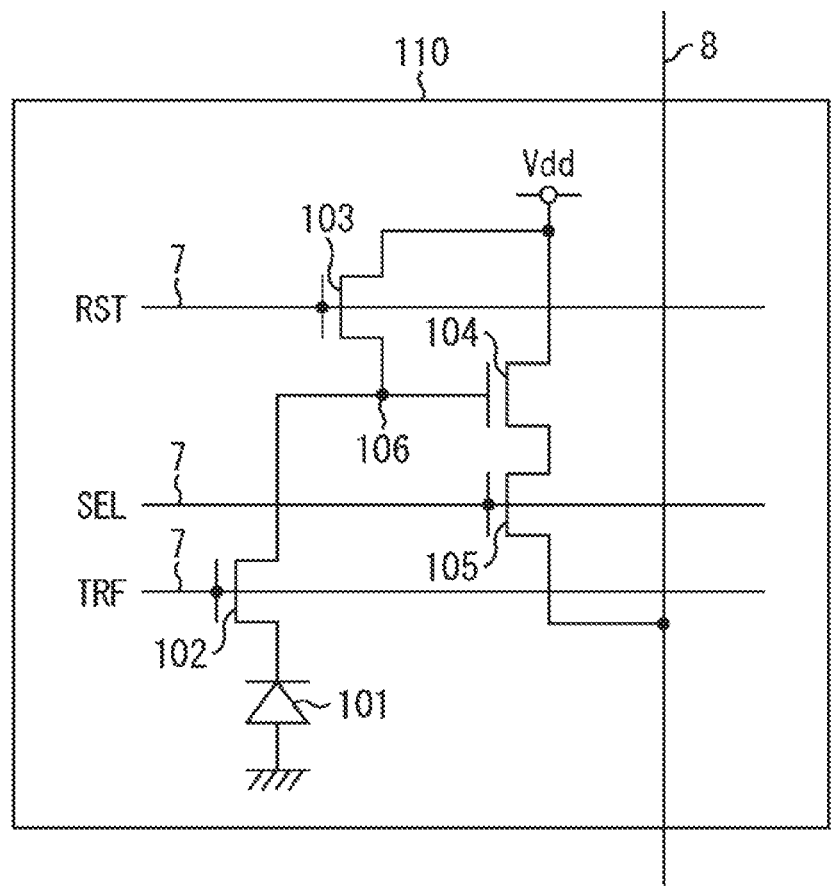
FIG. 3 is a circuit diagram depicting an example of a configuration of a pixel 110.

FIG. 3 is a circuit diagram depicting an example of a configuration of a pixel 110.

Referring to FIG. 3, the pixel 110 includes a PD (Photo Diode) 101 and four FETs (Field Effect Transistors) 102, 103, 104, and 105 each in the form of an NMOS (negative channel MOS).

Further, in the pixel 110, the drain of the FET 102, source of the FET 103, and gate of the FET 104 are connected to each other, and an FD (Floating Diffusion) (capacitor) 106 for converting charge into a voltage is formed at the connection point of them.

The PD 101 is an example of a photoelectric conversion device that performs photoelectric conversion, and receives incident light to accumulate electric charge corresponding to the incident light to perform photoelectric conversion.

The PD 101 is connected (grounded) at the anode thereof to the ground, and is connected at the cathode thereof to the source of the FET 102.

The FET 102 is an FET for transferring the electric charge accumulated in the PD 101 from the PD 101 to the FD 106 and is hereinafter referred to also as transfer Tr 102.

The transfer Tr 102 is connected at the source thereof to the cathode of the PD 101 and is connected at the drain thereof to the FD 106.

Further, the transfer Tr 102 is connected at the gate thereof to a pixel driving line 7, and a transfer pulse TRF is supplied to the gate of the transfer Tr 102 through the pixel driving line 7.

Here, controlling signals to be supplied to the pixel driving lines 7 in order for the row scanning unit 3 to drive (control) the pixel 110 through the pixel driving lines 7 include not only the transfer pulse TRF but also a reset pulse RST and a selection pulse SEL hereinafter described.

The FET 103 is an FET for resetting the electric charge (voltage (potential)) accumulated in the FD 106 and is hereinafter referred to also as reset Tr 103.

The reset Tr 103 is connected at the drain thereof to a power supply Vdd.

Further, the reset Tr 103 is connected at the gate thereof to a pixel driving line 7 such that the reset pulse RST is supplied to the gate of the reset Tr 103 through the pixel driving line 7.

The FET 104 is an FET for amplifying (buffering) a voltage of the FD 106 and is hereinafter referred to also as amplification Tr 104.

The amplification Tr 104 is connected at the gate thereof to the FD 106 and is connected at the drain thereof to the power supply Vdd. Further, the amplification Tr 104 is connected at the source thereof to the drain of the FET 105.

The FET 105 is an FET for selecting an output of an electric signal (VSL voltage) to the VSL 8 and is hereinafter referred to also as selection Tr 105.

The selection Tr 105 is connected at the source thereof to the VSL 8.

Further, the selection Tr 105 is connected at the gate thereof to a pixel driving line 7 such that a selection pulse SEL is supplied to the gate of the selection Tr 105 through the pixel driving lines 7.

Here, the amplification Tr 104 is connected at the source thereof to the bias circuit 120 (FIG. 2) that serves as a current source through the selection Tr 105 and the VSL 8 to configure an SF (Source Follower) (circuit) from the amplification Tr 104 and the bias circuit 120. Accordingly, the voltage of the FD 106 becomes a VSL voltage on the VSL 8 through the SF.

The FD 106 is a region that is formed at a connection point among the drain of the transfer Tr 102, source of the FET 103, and gate of the FET 104 and converts the charge into a voltage like a capacitor.

It is to be noted that the pixel 110 can be configured without the selection Tr 105.

Further, as a configuration of the pixel 110, a configuration (FD sharing type) of a sharing pixel in which a plurality of sets of a PD 101 and a transfer Tr 102 share the components from the reset Tr 103 to the FD 106 can be adopted.

Further, as a configuration of the pixel 110, a configuration can be adopted in which the pixel 110 has a memory function for storing charge obtained by the PD 101 and can perform operation of a global shutter.

In the pixel 110 configured in such a manner as described above, the PD 101 receives incident light thereto and performs photoelectric conversion to start accumulation of electric charge corresponding to a light amount of the received incident light. It is to be noted here that, for the simplification of the description, it is assumed that the selection pulse SEL has the H level and the selection Tr 105 has an on state.

If predetermined time (exposure time) elapses after accumulation of electric charge into the PD 101 is started, then the row scanning unit 3 (FIG. 1) temporarily sets the transfer pulse TRF (from the L (Low) level) to the H (High) level.

Since the transfer pulse TRF temporarily becomes the H level, the transfer Tr 102 is temporarily placed into an on state.

When the transfer Tr 102 is placed into an on state, the charge accumulated in the PD 101 is transferred to and charged into the FD 106 through the transfer Tr 102.

The row scanning unit 3 temporarily sets, before it temporarily sets the transfer pulse TRF to the H level, the reset pulse RST to the H level to temporarily place the reset Tr 103 into an on state.

By placing the reset Tr 103 into an on state, the FD 106 is connected to the power supply Vdd through the reset Tr 103, and consequently, the charge in the FD 106 is swept out to the power supply Vdd through the reset Tr 103 to reset the charge.

Here, that the FD 106 is connected to the power supply Vdd to reset the charge in the FD 106 in such a manner as described above is resetting of the pixel 110.

After the charge in the FD 106 is reset, the row scanning unit 3 temporarily sets the transfer pulse TRF to the H level as described hereinabove. Consequently, the transfer Tr 102 is temporarily placed into an on state.

Since the transfer Tr 102 is placed into an on state, the electric charge accumulated in the PD 101 is transferred to and accumulated into the FD 106 after resetting through the transfer Tr 102.

The voltage (potential) corresponding to the electric charge accumulated in the FD 106 is outputted to the VSL 8 as the VSL voltage through the amplification Tr 104 and the selection Tr 105.

In the set (FIG. 2) of the comparator 140 and the counter 150 connected to the VSL 8, a reset level that is a VSL voltage immediately after resetting of the pixel 110 is performed is AD converted.

Further, in set of the comparator 140 and the counter 150, a signal level (including the reset level and a level that becomes a pixel value) that is a VSL voltage (voltage accumulated in the PD 101 and corresponding to the charge transferred to the FD 106) after the transfer Tr 102 is temporarily placed into an on state is AD converted.

Further, for example, in set of the comparator 140 and the counter 150, CDS (Correlated Double Sampling) for determining the difference between an AD conversion result of the reset level (hereinafter referred to also as reset level AD value) and an AD conversion result of the signal level (hereinafter referred to also as signal level AD value) as a pixel value is performed.

It is to be noted that it is possible to perform the CDS after AD conversion of the reset level and the signal level and also possible to perform the CDS during AD conversion of the reset level and the signal level.

For example, the CDS can be performed during AD conversion of the reset level and the signal level by starting counting by the counter 150 as AD conversion of the signal level using, as an initial value, a complement of the count value of the counter 150 as an AD conversion result of the reset level.

<Outline of Operation of Image Pickup Device>

Figure 4:
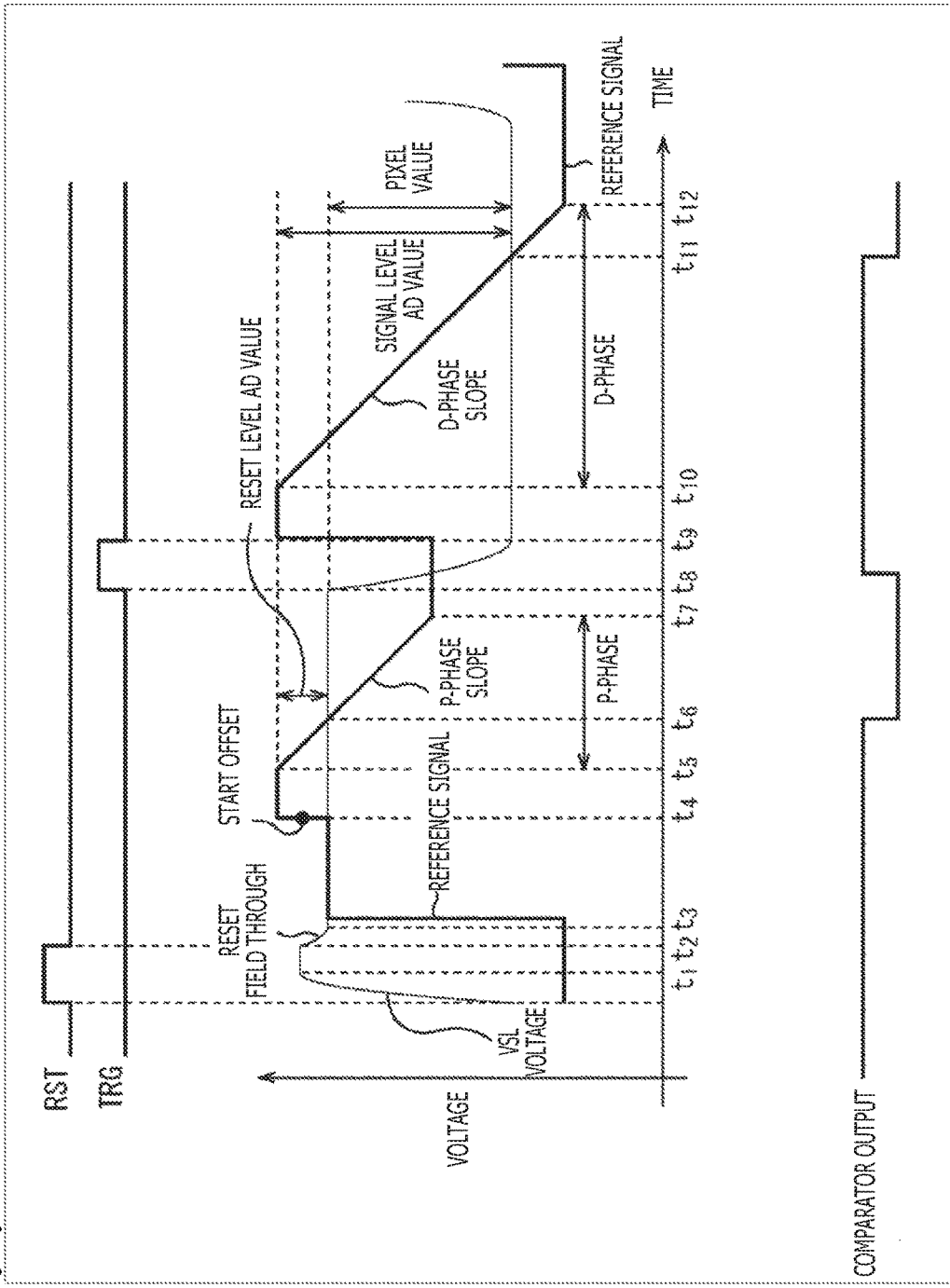
FIG. 4 is a view illustrating an outline of operation of an image pickup device.

FIG. 4 is a view illustrating an outline of operation of the image pickup device (FIG. 1).

It is to be noted that, in FIG. 4, the axis of abscissa represents time and the axis of ordinate represents a voltage.

FIG. 4 is a waveform diagram depicting an example of the VSL voltage supplied from the pixel 110 to the comparator 140 through the VSL 8 and the reference signal (voltage) supplied from the reference signal generation unit 130 to the comparator 140.

It is to be noted that, in FIG. 4, also the transfer pulse TRF supplied to (the gate of) the transfer Tr 102 (FIG. 3), reset pulse RST supplied to the reset Tr 103, and comparator output of the comparator 140 are depicted together with the VSL voltage and the reference signal.

In the image pickup device, the reset pulse RST is temporarily set to the H level and, as a result, the pixel 110 is reset.

In the resetting of the pixel 110, as described hereinabove with reference to FIG. 3, the FD 106 is connected to the power supply Vdd through the reset Tr 103 and the charge in the FD 106 is reset. Therefore, the VSL voltage outputted from the pixel 110, namely, the VSL voltage on the VSL 8 in the pixel 110 outputted from the FD 106 through the amplification Tr 104 and the selection Tr 105, increases and becomes a voltage corresponding to the power supply Vdd at time $t_1$.

The VSL voltage maintains the voltage corresponding to the power supply Vdd within a time period within which the FD 106 remains connected to the power supply Vdd, and, if the reset pulse RST is thereafter set to the L level at time $t_2$, then a little charge enters the FD 106 by movement of some charge in the pixel 110 and, as a result, the VSL voltage drops a little.

In FIG. 4, the VSL voltage drops a little from time $t_2$, at which the reset pulse RST changes to the L level, to time $t_3$ later than time $t_2$ by movement of charge in the pixel 110.

The drop of the VSL voltage that appears after resetting of the pixel 110 in such a manner as described above is called reset feed-though.

Thereafter, an auto zero process is performed, and the comparator 140 is set such that the relationship in magnitude between the VSL voltage and the reference signal can be decided (compared) with reference to that the VSL voltage and the reference signal provided to the comparator 140 upon the auto zero process coincide with each other.

In the auto zero process, the capacitors 141 and 142 (FIG. 2) are charged such that the voltages to be applied to the two input terminals of the comparator 140 become equal to each other.

As a result, (the waveform of) the reference signal is formed such that the voltage dropping by the reset feed-though from the VSL voltage while the pixel 110 is reset is made, as it were, a reference.

The reference signal generation circuit 130 raises the reference signal by a predetermined voltage at time $t_4$ after the auto zero process is completed (ended).

Here, to raise the reference signal by the predetermined voltage at time $t_4$ after the auto zero process is ended is hereinafter referred to as start offset.

Further, while the reference signal generation circuit 130 gradually decreases the voltage of the reference signal at a fixed rate for the AD conversion of the VSL voltage, a portion of a ramp signal in the reference signal at which the voltage decreases at the fixed rate is referred to also as slope.

The reference signal generation circuit 130 performs, at time $t_4$, start offset for offsetting the reference signal by a predetermined voltage in the opposite direction to the direction of the slope (direction in which the voltage of the reference signal varies).

Thereafter, the reference signal generation circuit 130 gradually decreases (lowers) the voltage of the reference signal at a fixed rate within an AD conversion period of the reset level provided as a fixed period from time $t_5$ to time $t_7$.

Accordingly, the reference signal within the period from time $t_5$ to time $t_7$ forms a slope.

The slope of the reference signal within the period from time $t_5$ to time $t_7$ is a slope for AD converting the reset level of the VSL voltage (VSL voltage of the pixel 110 immediately after resetting (VSL voltage after the pixel 110 is reset and a drop of the voltage by the reset feed-through occurs)), and the period of the slope (period from time $t_5$ to time $t_7$) is hereinafter referred to also as P (Preset) phase. Further, the slope of the P phase is referred to also as P-phase slope.

Here, since the comparator 140 is set by the auto zero process after resetting of the pixel 110 such that the VSL voltage and (the voltage of) the reference signal upon the auto zero process coincide with each other, according to the start offset by which the reference signal is raised by the predetermined voltage at time $t_4$ after the auto zero process is ended, the reference signal becomes higher in voltage than the VSL voltage (reset level). Accordingly, the comparator output of the comparator 140 becomes the H level representing that the reference signal is higher than the VSL voltage at starting time $t_5$ of the P phase.

The counter 150 starts counting of a reference clock at a start timing of the AD conversion period of the reset level, namely, at starting time $t_5$ of the P-phase slope.

In the P phase, (the voltage of) the reference signal gradually decreases, and in FIG. 4, at time $t_6$ of the P phase, the reference signal and the VSL voltage as a reset level become coincident with each other, and the relationship in magnitude between the reference signal and the VSL voltage is reversed from that upon starting of the P phase.

As a result, the comparator output of the comparator 140 inverts (reverses) from the H level upon starting of the P phase to the L level.

When the comparator output of the comparator 140 becomes the L level, the counter 150 stop its counting of a reference clock and the count value of the counter 150 at the time becomes an AD conversion result of the reset level (reset level AD value).

After the end of the P phase, in the image pickup device, the level of the transfer pulse TRF changes from the L level to the H level and the H level is maintained for the period from time $t_8$ to time $t_9$, and as a result, the charge accumulated in the PD 101 by photoelectric conversion in the pixel 110 (refer to FIG. 3) is transferred to and accumulated into the PD 106 through the transfer Tr 102.

Since charge is accumulated into the PD 106, the VSL voltage corresponding to the charge accumulated in the PD 106 drops, and when the transfer pulse TRF changes from the H level to the L level at time $t_9$, the transfer of charge from the PD 101 into the PD 106 ends and the VSL voltage becomes a signal level (voltage) corresponding to the charge accumulated in the PD 106.

Further, after the end of the P phase, the reference signal generation circuit 130 raises the reference signal to a voltage equal to that, for example, upon starting of the P phase.

Since the VSL voltage becomes a voltage corresponding to charge accumulated in the PD 106 and the reference signal rises to a voltage equal to that upon starting of the P phase as described above, the relationship in magnitude between the reference signal and the VSL voltage reverses again.

As a result, the comparator output of the comparator 140 becomes the H level.

After the reference signal generation circuit 130 raises the reference signal to a voltage equal to that upon starting of the P phase, it gradually decreases the voltage of the reference signal, for example, at a rate equal that of the variation in the case of the P phase within an AD conversion period of the signal level provided by a fixed period from time $t_{10}$ to time $t_{12}$ (the period need not be coincident with the fixed period (P phase) from time $t_5$ to time $t_7$).

Accordingly, the reference signal within the period from time $t_{10}$ to time $t_{12}$ becomes a ramp signal and forms a slope similarly to the reference signal of the P phase from time $t_5$ to time $t_7$.

The slope of the reference signal within the period from time $t_{10}$ to time $t_{12}$ is a slope for AD converting the signal level of the VSL voltage (VSL voltage immediately after transfer of charge from the PD 101 to the PD 106 in the pixel 110 (FIG. 3)), and the period of this slope (period from time $t_{10}$ to time $t_{12}$) is hereinafter referred to also as D (Data) phase. Further, the slope of the D phase is referred to also as D-phase slope.

Here, at starting time $t_{10}$ of the D phase, the reference signal is higher than the VSL voltage similarly as in the case of that at starting time $t_5$ of the P phase. Accordingly, the comparator output of the comparator 140 becomes, at starting time $t_{10}$ of the D phase, the H level that indicates that the reference signal is higher than the VSL voltage.

The counter 150 starts counting of a clock at a starting timing of the AD conversion period of the signal level, namely, for example, at starting time $t_{10}$ of the D-phase slope.

In the D phase, (the voltage of) the reference signal gradually decreases, and in FIG. 4, the reference signal and the VSL voltage as the signal level become coincident with each other at time $t_{11}$ of the D phase and the relationship in magnitude between the reference signal and the VSL voltage reverses from that upon starting of the D phase.

As a result, also the comparator output of the comparator 140 reverses from the H level upon starting of the D phase to the L level.

When the comparator output reverses to the L level, the counter 150 ends the counting of the reference clock. Then, the count value of the counter 150 at the time becomes an AD conversion result of the signal level (signal level AD value).

The column signal processing unit 4 performs AD conversion for determining a reset level AD value in the P phase in such a manner as described above and performs AD conversion for determining a signal level AD value in the D phase, and further performs CDS for determining the difference between the reset level AD value and the signal level AD value. Then, the difference obtained as a result of the CDS is outputted as a pixel value.

It is to be noted that the counter 150 can execute the CDS while performing AD conversion of the P phase and the D phase.

In particular, the CDS can be performed together with AD conversion of the P phase and the D phase, for example, by performing counting as AD conversion of the P phase in the negative direction and performing counting as AD conversion of the D phase in the forward direction using a result of the counting of the P phase as an initial value.

Further, the CDS can be performed together with AD conversion of the P phase and the D phase, for example, by performing counting of the P phase in the forward direction and performing counting of the D phase in the forward direction using a complement of a counting result of the P phase (value of the counting result whose sign is changed to the negative) as an initial value.

It is to be noted that, although a reference signal whose voltage decreases with a fixed inclination in the P phase and the D phase is adopted here, as the reference signal, a signal can be adopted whose voltage increases with a fixed inclination in the P phase and the D phase.

<First Example of Configuration of Reference Signal Generation Circuit 130>

Figure 5:
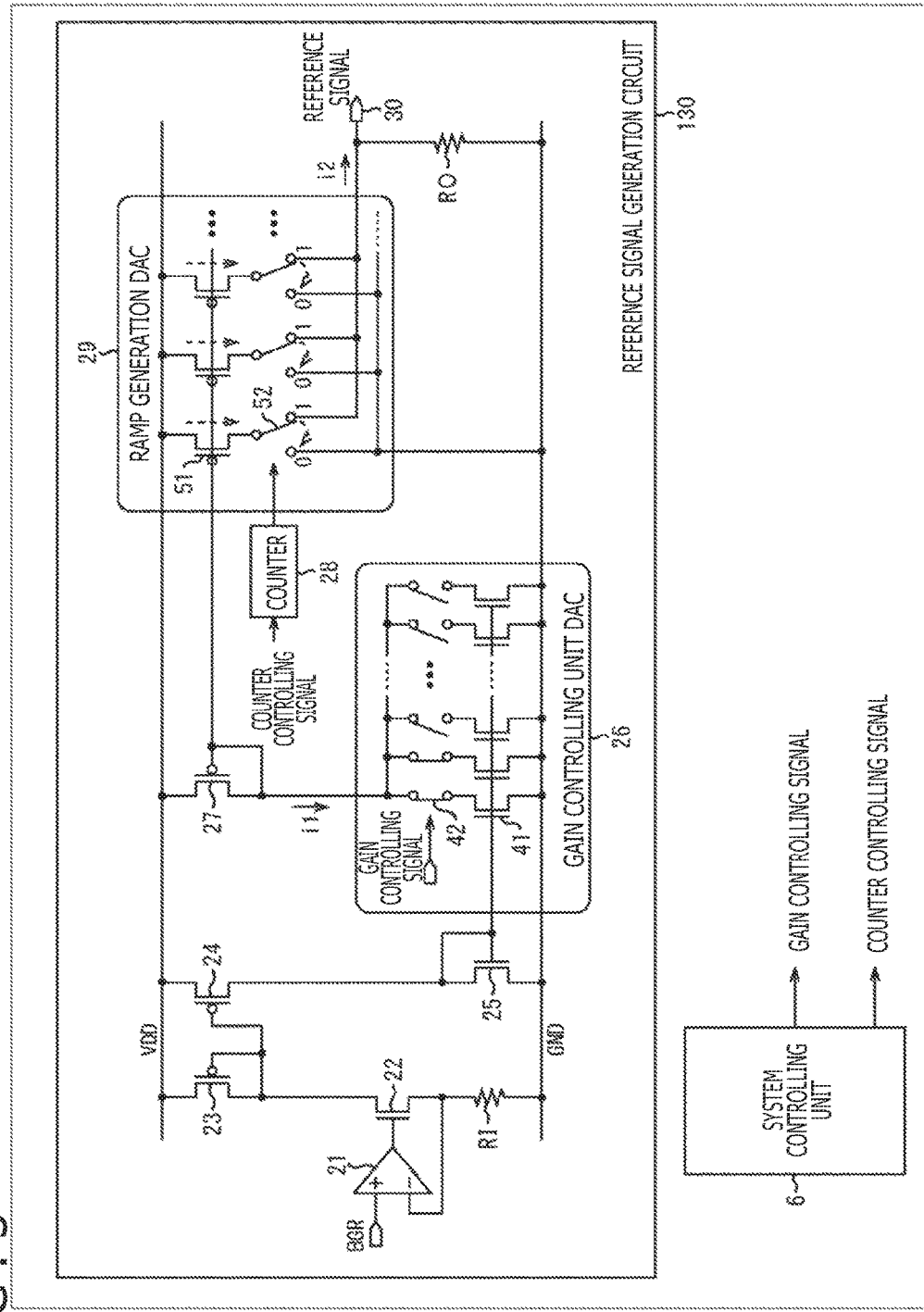
FIG. 5 is a circuit diagram depicting a first example of a configuration of a reference signal generation circuit 130.

FIG. 5 is a circuit diagram depicting a first example of a configuration of the reference signal generation circuit 130 of FIG. 2.

Referring to FIG. 5, the reference signal generation circuit 130 includes an operational amplifier 21, FETs 22, 23, 24, and 25, a gain controlling DAC 26, an FET 27, a counter 28, a ramp generation DAC 29, an output terminal 30, an input resistor RI, and a terminating resistor RO. The FETs 22 and 25 are NMOS FETs, and the FETs 23, 24, and 27 are PMOS FETs. Which one of an NMOS FET and a PMOS FET is to be used for each of the FETs can be selected suitably in accordance with a circuit configuration or the like.

Further, in FIG. 5, as controlling signals for controlling the reference signal generation circuit 130, a gain controlling signal and a counter controlling signal are supplied from the system controlling unit 6 to the reference signal generation circuit 130.

A reference voltage BGR is supplied to the non-negated input terminal (+) of the operational amplifier 21. The negated input terminal (−) of the operational amplifier 21 is connected to one end of an input resistor RI that is connected at the other end thereof to the ground GND. The operational amplifier 21 is connected at an output terminal thereof to the gate of the FET 22.

The FET 22 is connected at the drain thereof to the drain of the FET 23 and is connected at the source thereof to a connection point of the negated input terminal (−) of the operational amplifier 21 and the input resistor RI.

The FET 23 is connected at the gate thereof to the gate of the FET 24 and the drain of the FET 23 and is connected at the source thereof to a power supply VDD.

The FET 24 is connected at the source thereof to the power supply VDD and is connected at the drain thereof to the drain of the FET 25.

Here, the FET 23 and the FET 24 configure a current mirror circuit. The current mirror circuit has a mirror ratio provided by a value corresponding to the ratio in size between the FETs 23 and 24, and current (mirror current) equal to mirror ratio times the current flowing through the FE 23 (between the source and the drain) flows through the FET 24 (between the source and the drain).

The FET 25 is connected at the gate thereof to the drain of the FET 25 and the gate of a plurality of FETs 41 that configure the gain controlling DAC 26. The FET 25 is connected at the source thereof to the ground GND.

The gain controlling DAC 26 controls the analog gain of the image pickup device of FIG. 1, namely, the inclination of the slope of the reference signal, under the control of the system controlling unit 6.

In particular, the gain controlling DAC 26 includes a plurality of NMOS FETs 41, and switches 42, whose numbers are equal to the number of FETs 41.

The FETs 41 are connected at the gate thereof to the gate of the FET 25 and are connected at the drain thereof to the drain of the FET 27 through the switches 42. The FETs 41 are connected at the source thereof to the ground GND.

Here, the FET 25 and the FETs 41 configure a current mirror circuit. The current mirror circuit has a mirror ratio provided by a value corresponding to the ratio in size between the FET 25 and the FETs 41, and current equal to mirror ratio times the current flowing through the FET 25 flows to the FETs 41.

The switches 42 are switched on/off in accordance with a gain controlling signal from the system controlling unit 6 to switch on/off the connection between the drain of the FETs 41 and the drain of the FET 27.

In the gain controlling DAC 26, if a switch 42 or switches 42 are switched on, then to an FET 41 or FETs 41 to which the switch 42 or switches 42 in an on state are connected, current equal to the mirror ratio times the current flowing through the FET 25 flows.

Accordingly, as the number of the switches 42 that indicate an on state increases, current i1 that flows through the FET 27 to which the FETs 41 are connected increases, and as a result, the variation amount of current flowing to the terminating resistor RO from the ramp generation DAC 29 hereinafter described (equal to current corresponding to the current i1) increases.

Here, in the reference signal generation circuit 130 of FIG. 5, a voltage drop of the terminating resistor RO is outputted as a reference signal from the output terminal 30. As the variation amount of current flowing through the terminating resistor RO increases, the variation amount of the voltage drop of the terminating resistor RO, namely, the inclination of the slope (ramp signal) of the reference signal, increases.

As the inclination of the slope of the reference signal increases, the count value of the counter 150 (FIG. 2) regarding the variation of the VSL voltage, namely, the variation of the AD conversion result, decreases, and consequently, the analog gain of the image pickup device decreases.

From the foregoing, in order to decrease the analog gain of the image pickup device, the current i1 to flow to the FET 27 is increased, and consequently, the inclination of the slope of the reference signal increases.

On the other hand, in order to increase the analog gain of the image pickup device, the current i1 flowing to the FET 27 is decreased, and consequently, the inclination of the slope of the reference signal decreases.

The FET 27 is connected at the gate thereof to the drain of the FET 27 and the gate of a plurality of FETs 51 that configure the ramp generation DAC 29, and is connected at the source thereof to the power supply VDD.

The counter 28 counts a count value (hereinafter referred to as connection number count value) as a connection number by which the FETs 51 hereinafter described configuring the ramp generation DAC 29 are connected to the output terminal 30 under the control of the system controlling unit 6. Further, the counter 28 controls switches 52 hereinafter described, which configure the ramp generation DAC 29, in accordance with the connection number count value to connect FETs 51, whose numbers are equal to the connection number count value, to the output terminal 30.

The ramp generation DAC 29 generates current for obtaining a voltage to be made a reference signal under the control of the counter 28. In particular, for example, the ramp generation DAC 29 generates current that decreases with a fixed inclination in order to form a slope of a reference signal.

The ramp generation DAC 29 includes a plurality of FETs 51 as a plurality of current sources, and switches 52, whose numbers are equal to the number of the plurality of FETs 51.

Here, the number of the plurality of FETs 41 and switches 42 configuring the gain controlling DAC 26 and the number of the plurality of FETs 51 and switches 52 configuring the ramp generation DAC 29 can be determined independently of each other.

The FETs 51 are connected at the gate thereof to the gate of the FET 27 and are connected at the drain thereof to the switches 52. The FETs 51 are connected at the source thereof to the power supply VDD.

Here, the FET 27 and the FETs 51 configure a current mirror circuit. The current mirror circuit has a mirror ratio provided by a value corresponding to the ratio in size between the FET 27 and the FETs 51, and current equal to mirror ratio times the current i1 flowing to the FET 27 flows to the FETs 51.

The switches 52 select the terminal #0 connected to the ground GND or the terminal #1 connected to the output terminal 30 under the control of the counter 28.

Accordingly, (the drain of) an FET 51 as a current source is connected to the ground GND in a case where a switch 52 selects the terminal #0 but is connected to the output terminal 30 in a case where the switch 52 selects the terminal #1.

As described above, the FET 51 as a current source can select connection to the output terminal 30 (or connection to the ground GND) by the switch 52.

Here, the sum of current supplied by the FETs 51 connected to the output terminal 30 in the ramp generation DAC 29, namely, by the FETs 51 connected to the switch 51 that select the terminal #1, is referred to also as current i2.

Upon starting of the P phase and the D phase, the plurality of switches 52 configuring the ramp generation DAC 29 all select the terminal #1, and thereafter, the switches 52 are switched one by one or by every predetermined number equal to or greater than 2 so as to select the terminal #0 as time passes until an end of the P phase and the D phase.

As a switch 52 is switched from the terminal #1 to the terminal #0, the number of the FETs 51 connected to the output terminal 30 decreases and the current i2 supplied by the ramp generation DAC 29 decreases.

The output terminal 30 is connected to the drain of the FETs 51 through (the terminal #1 of) the switches 52. Further, the output terminal 30 is connected to one end of the terminating resistor RO that is connected at the other end thereof to the ground GND.

Accordingly, current supplied from the FETs 51 connected to the output terminal 30, namely, the current i2 supplied by the ramp generation DAC 29, flows to the terminating resistor RO connected to the output terminal 30.

The voltage drop caused by the terminating resistor RO at this time is outputted as a reference signal from the output terminal 30.

In the reference signal generation circuit 130 configured in such a manner as described above, a predetermined number of switches 42 in the gain controlling DAC 26 are switched on in accordance with a gain controlling signal.

On the other hand, current in accordance with the reference voltage BGR and the input resistor RI flows to the FET 22. The current flowing through the FET 22 flows to the FET 23, and current equal to mirror ratio times the current flowing through the FET 23 flows to the FET 24.

The current flowing through the FET 24 flows to the FET 25, and current equal to mirror ratio times the current flowing through the FET 25 flows to the FETs 41 connected to the switches 42 that are in an on state in the gain controlling DAC 26.

To the FET 27, current i1 that is the sum of current flowing through the FETs 41 connected to the switches 42 that are on, and to the respective FETs 51 of the ramp generation DAC 29, current equal to mirror ratio times the current i1 flowing to the FET 27 flows.

The current i2 that is the sum of current flowing to the FETs 51 connected to the switches 52 by which the terminal #1 is selected from among the plurality of FETs 51 configuring the ramp generation DAC 29 flows to the terminating resistor RO connected to the output terminal 30.

The voltage drop of the terminating resistor RO caused by the current i2 flowing through the terminating resistor RO is outputted as a reference signal from the output terminal 30.

In the ramp generation DAC 29, upon starting of the P phase and the D phase, the plurality of switches 52 configuring the ramp generation DAC 29 all select the terminal #1, and thereafter, the switches 52 are switched, for example, one by one from the terminal #1 to the terminal #0 as time passes till an end of the P phase and the D phase.

If one switch 52 is switched from the terminal #1 to the terminal #0, then the current i2 decreases by the current flowing to the FET 51 to which the switch 52 is connected.

Accordingly, as the switches 52 are switched one by one from the terminal #1 to the terminal #0, the current i2 decreases by an amount of current flowing through one FET 51, and as a result, the voltage drop of the terminating resistor RO as a reference signal decreases.

Consequently, a reference signal having a P-phase slope and a D-phase slope along which the voltage (level) decreases at a fixed rate is generated.

It is to be noted that, while here a reference signal whose voltage decreases at a fixed rate is generated by switching the switches 52 one by one from the terminal #1 to the terminal #0, namely, by decreasing the number of the FETs 51 as power supply sources to be connected to the output terminal 30, a reference signal whose voltage conversely increases at a fixed rate can otherwise be generated.

In particular, by switching the switches 52, for example, one by one from the terminal #0 to the terminal #1 to increase the number of the FETs 51 as current sources to be connected to the output terminal 30, a reference signal whose voltage increases at a fixed rate can be generated.

Figure 6:
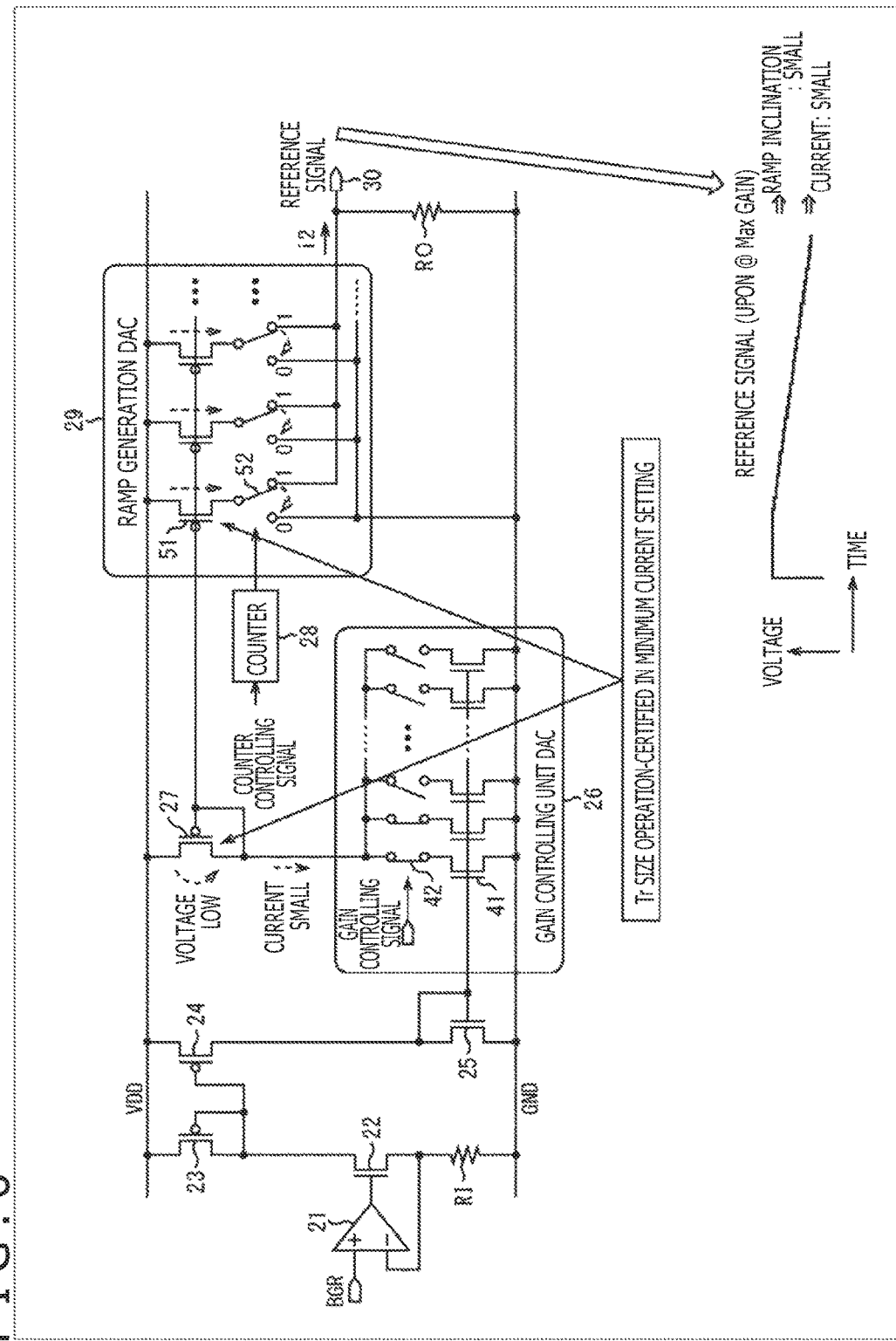
FIG. 6 is a view illustrating an example of operation of the reference signal generation circuit 130 when an analog gain is set to a maximum value.

FIG. 6 is a view illustrating an example of operation of the reference signal generation circuit 130 of FIG. 5 when the analog gain is set to a maximum value.

In order to set the analog gain to a maximum value, the switches 42 of the gain controlling DAC 26 are controlled such that the current i1 flowing to the FET 27 is minimized.

In FIG. 6, when two switches 42 are switched on, the current i1 corresponding to a maximum analog gain (minimum value of the current i1) is the sum of current flowing to the FETs 41 connected to each of the two switches 42, and therefore, two switches 42 are on.

When the current i1 has a minimum value, also the current flowing to the respective FETs 51 of the ramp generation DAC 29 has a minimum value.

Accordingly, the slope of the reference signal indicates a voltage having a gentle (small) inclination and decreasing voltage by voltage corresponding to the minimum value of current flowing through the FETs 51.

It is to be noted that the FET 27 is configured with a size with which it operates in a saturation region when the current i1 of the minimum value flows. Also the FETs 51 of the ramp generation DAC 29 are configured with a size with which they operate in a saturation region when current corresponding to the minimum value of the current i1 flows.

Figure 7:
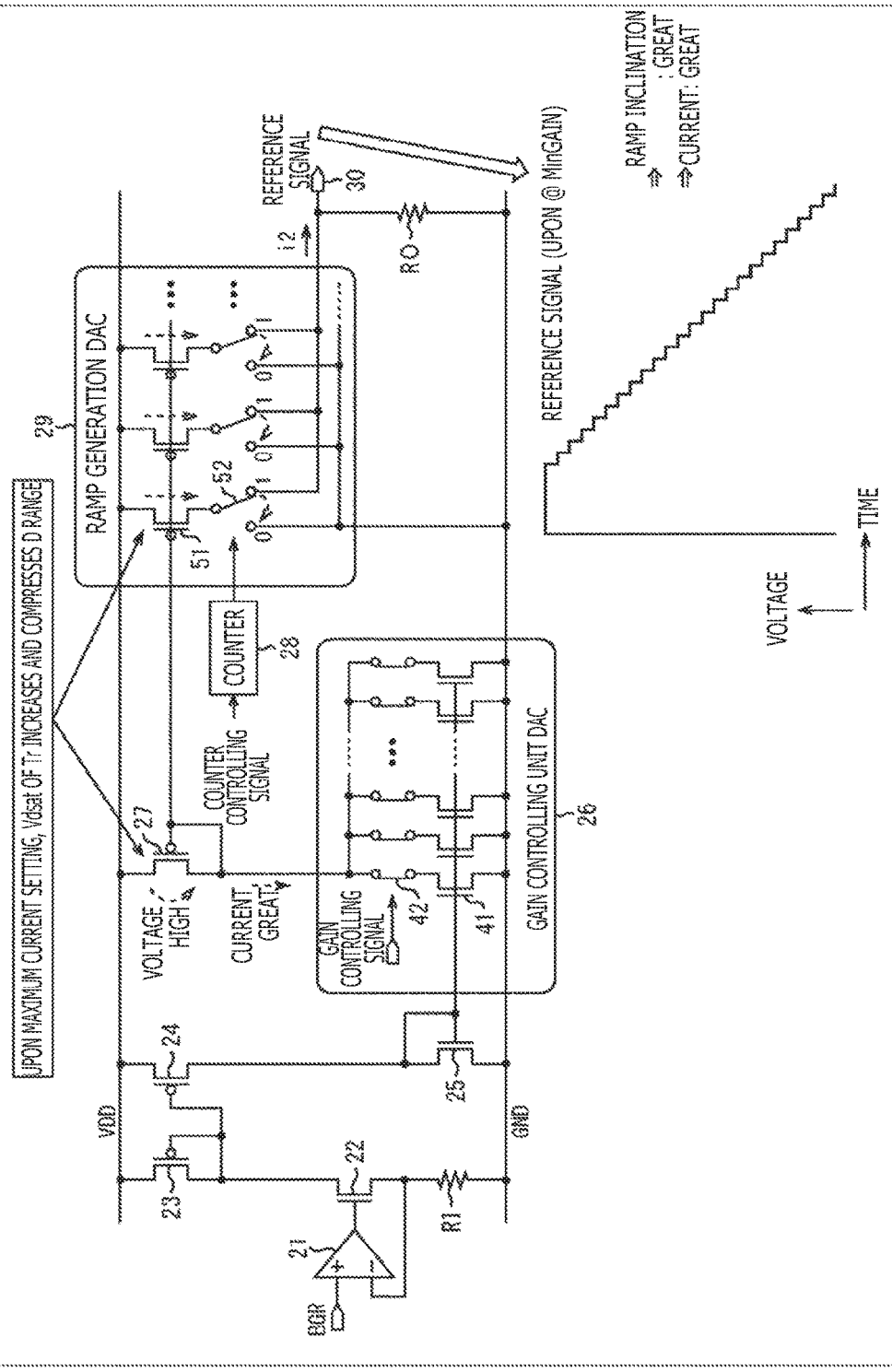
FIG. 7 is a view illustrating an example of operation of the reference signal generation circuit 130 when an analog gain is set to a minimum value.

FIG. 7 is a view illustrating an example of operation of the reference signal generation circuit 130 of FIG. 5 when the along gain is set to a minimum value.

When the analog gain is set to a minimum value, the switches 42 of the gain controlling DAC 26 are controlled such that the current i1 flowing to the FET 27 is maximized.

In FIG. 7, the current i1 corresponding to the minimum analog gain (maximum value of the current i1) is the sum of current flowing to all of the FETs 41 configuring the gain controlling DAC 26. Therefore, all of the switches 42 configuring the gain controlling DAC 26 are on.

When the current i1 has a maximum value, also the current flowing to the respective FETs 51 of the ramp generation DAC 29 indicates a maximum value.

Accordingly, the slope of the reference signal indicates a voltage of a steep (great) inclination along which the voltage successively decreases by a voltage corresponding to the maximum value of current flowing to the FETs 51.

Incidentally, if the analog gain is set to a low value in the reference signal generation circuit 130, then the current i1 flowing to the FET 27 becomes great and overdrive voltage Vdsat that is a minimum value of the drain-source voltage when the FET 27 operates in a saturation region becomes high. Similarly, also the overdrive voltage Vdsat of the FETs 51 of the ramp generation DAC 29 becomes high.

As the overdrive voltage Vdsat of the FET 27 and the FETs 51 becomes high, the dynamic range of the reference signal generation circuit 130, and hence the dynamic range of (the slope of) the reference signal, is compressed.

<Second Example of Configuration of Reference Signal Generation Circuit 130>

Figure 8:
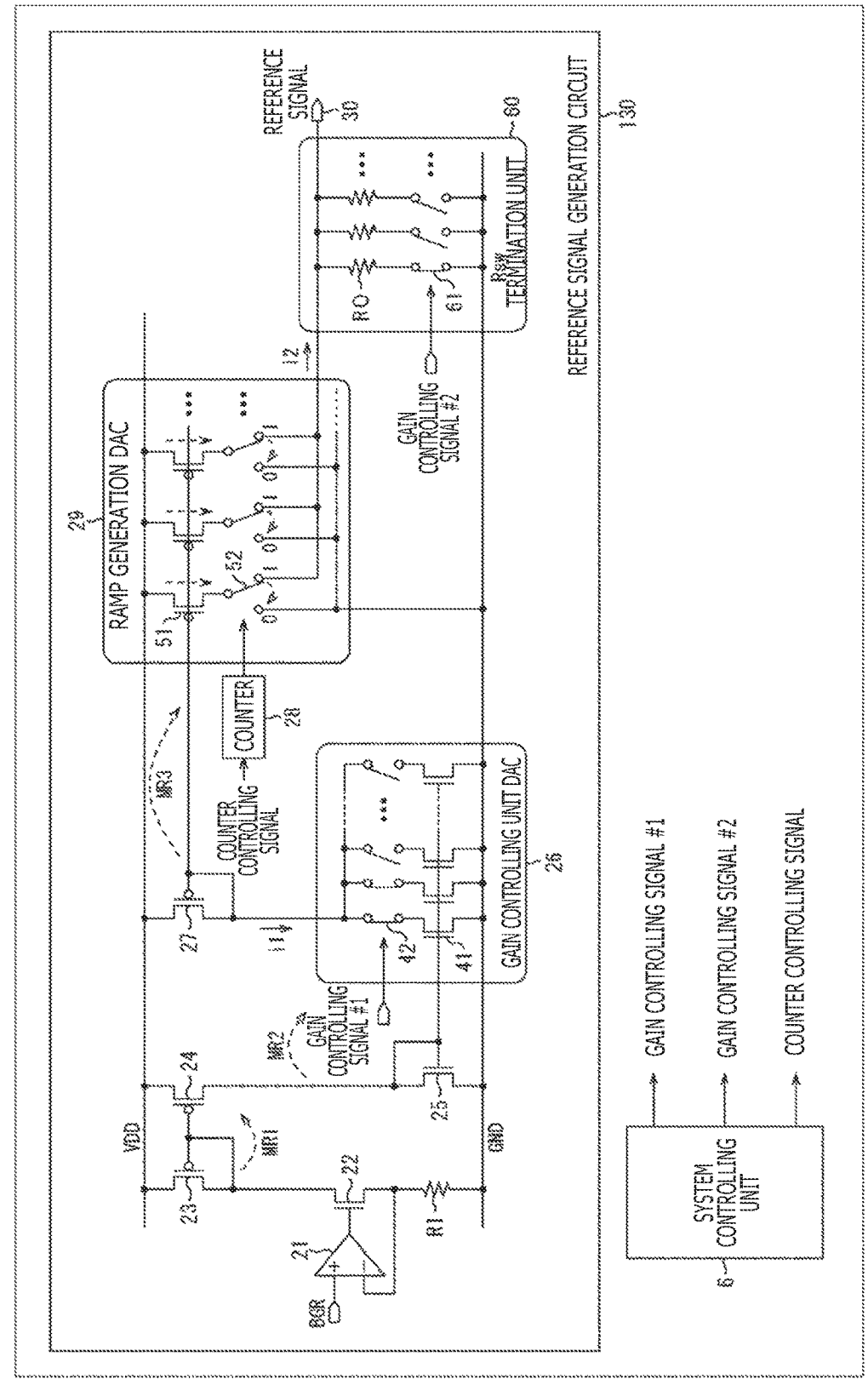
FIG. 8 is a circuit diagram depicting a second example of a configuration of the reference signal generation circuit 130.

FIG. 8 is a circuit diagram depicting a second example of a configuration of the reference signal generation circuit 130 of FIG. 2.

It is to be noted that, in FIG. 8, portions corresponding to those of FIG. 5 are denoted by the same reference symbols, and in the following description, description of them is omitted suitably.

Referring to FIG. 8, the reference signal generation circuit 130 includes an operational amplifier 21, FETs 22 to 25, a gain controlling DAC 26, an FET 27, a counter 28, a ramp generation DAC 29, an output terminal 30, a termination unit 60, and an input resistor RI.

Accordingly, in FIG. 8, the reference signal generation circuit 130 is common to that of FIG. 5 in that it includes the components from the operational amplifier 21 to the output terminal 30, and the input resistor RI.

However, the reference signal generation circuit 130 of FIG. 8 is different from that of FIG. 5 in that it includes the termination unit 60 in place of the terminating resistor RO.

Further, in FIG. 8, as controlling signals for controlling the reference signal generation circuit 130, gain controlling signals #1 and #2 and a counter controlling signal are supplied from the system controlling unit 6 to the reference signal generation circuit 130.

The gain controlling signal #1 and the counter controlling signal are used to control the switch 42 and the counter 28, respectively, similarly as in the case of FIG. 5. The gain controlling signal #2 is used to control switches 61 hereinafter described that configure the termination unit 60.

The termination unit 60 includes a plurality of terminating resistors RO, and switches 61, whose numbers are equal to the number of the plurality of terminating resistors RO.

Here, the number of terminating resistors RO and switches 61 configuring the termination unit 60 can be determined independently of the number of FETs 41 and switches 42 configuring the gain controlling DAC 26 and of the number of FETs 51 and switches 52 configuring the ramp generation DAC 29.

In the termination unit 60, the terminating resistors RO are connected at one end thereof to the output terminal 30 and at the other end thereof to the ground GND thorough the switches 61.

Accordingly, the plurality of terminating resistors RO configuring the termination unit 60 are connected in parallel to each other through the switches 61.

The switches 61 are configured, for example, from an NMOS FET and switches on/off in accordance with the gain controlling signal #2.

If a switch 61 is switched on, then the corresponding terminating resistor RO connected at one end thereof to the output terminal 30 is connected at the other end thereof to the ground GND through the switch 61 having switched on. Consequently, current of the FETs 51 connected to the output terminal 30, namely, at least part of the current i2 supplied from the ramp generation DAC 29, flows to the terminating resistor RO.

Accordingly, the switches 61 can be considered switches that select the terminating resistors RO from which current of the FETs 51 as current sources connected to the output terminal 30 is to be supplied.

In FIG. 8, a voltage drop of the termination unit 60 is outputted as a reference signal from the output terminal 30.

Since, in the termination unit 60, as the number of the switches 61 that are on increases, an increased number of terminating resistors RO are connected in parallel, and therefore, the impedance of the termination unit 60 decreases and the voltage drop of the termination unit 60 decreases.

When the voltage drop of the termination unit 60 is small, the variation amount of the voltage drop of the termination unit 60 with respect to the variation of the current i2, namely, the inclination of the slope (ramp signal) of the reference signal, decreases and the analog gain increases.

On the other hand, when the voltage drop of the termination unit 60 is great, the variation amount of the voltage drop of the termination unit 60 with respect to the variation of the current i2, namely, the inclination of the slope of the reference signal, increases and the analog gain decreases.

Accordingly, by controlling the switches 61 to increase or decrease the number of terminating resistors RO connected in parallel to each other, the analog gain can be adjusted.

Further, in the reference signal generation circuit 130 of FIG. 8, similarly as in the case of FIG. 5, upon starting of the P phase and the D phase, the plurality of switches 52 configuring the ramp generation DAC 29 all select the terminal #1, and thereafter, the switches 52 are switched, for example, one by one from the terminal #1 to the terminal #0 as time passes till an end of the P phase and the D phase.

When one switch 52 is switched from the terminal #1 to the terminal #0, then the current i2 decreases by current that is to flow to the FET 51 to which the switch 52 is connected, and the voltage drop of the termination unit 60 as a reference signal decreases by the decrease of the current i2.

Consequently, a reference signal having a P-phase slope and a D-phase slope along which the voltage (level) decreases at a fixed rate is generated.

Now, the mirror ratio of the current mirror circuit configured from the FET 23 and the FET 24 is represented by MR1; the mirror ratio of the current mirror circuit configured from the FET 25 and the FETs 41 is represented by MR2; and the mirror ratio of the current mirror circuit configured from the FET 27 and the FETs 51 is represented by MR3.

In this case, (the voltage of) the reference signal VR can be represented by an expression (1).

$$VR=(BGR/RI)*MR1*(MR2*N_{GA})*(MR3*N_{RMP})*(RO+Rsw)/N_{RO} \quad (1)$$

$N_{GA}$ represents the number of switches 42 that are on under the control of the gain controlling signal #1, namely, the number of FETs 41 through which current is flowing.

$N_{RMP}$ represents the number of the switches 52 by which the terminal #1 is selected, namely, the number of the FETs 51 connected to the output terminal 30.

$N_{RO}$ represents the number of the switches 61 that are on under the control of the gain controlling signal #2, namely, the number of the terminating resistors RO connected in parallel between the output terminal 30 and the ground GND.

$R_{SW}$ represents the on resistance of the switches 61 when the switches 61 are on.

The step voltage of the reference signal VR represented by the expression (1), namely, the step voltage $\Delta VR$ that is a variation amount of (the voltage of) the reference signal VR when one switch 52 is switched, can be represented by an expression (2).

$$\Delta VR=\{(BGR/RI)*MR1*(MR2*N_{GA})*(MR3* \\ (N_{RMP}+1))*(RO+Rsw)/N_{RO}\}-\{(BGR/RI)*MR1* \\ (MR2*N_{GA})*(MR3*N_{RMP})*(RO+Rsw)/N_{RO}\}= \\ (BGR/RI)*MR1*MR2*N_{GA}*MR3*(RO+Rsw) \\ N_{RO} \quad (2)$$

Further, the analog gain GA of the reference signal generation circuit 130 of FIG. 8 can be represented by an expression (3).

$$GA=(N_{GA,0dB}/N_{GA})*(N_{RO}/N_{RO,0dB}) \quad (3)$$

$N_{GA,0dB}$ is the number of switches 42 to be switched on when the analog gain is to be set to 0 dB, namely, the number of FETs 41 to which current is to be supplied.

$N_{RO,0dB}$ represents the number of switches 61 to be switched on when the analog gain is to be set to 0 dB, namely, the number of terminating resistors RO to be connected in parallel.

Here, the analog gain of the reference signal generation circuit 130 of FIG. 5 is represented by $N_{GA,0dB}/N_{GA}$. Accordingly, when an analog gain of the same range as that of the reference signal generation circuit 130 of FIG. 5 is to be implemented, the reference signal generation circuit 130 can suppress the difference in current (current variation width) flowing to the FETs 27, 41, and 51 by the amount of $N_{RO}/N_{RO,0dB}$ of the expression (3) between the current when the analog gain is in the maximum and the current when the analog gain is in the minimum.

As a result, in a case where the analog gain is to be set to the minimum in the reference signal generation circuit 130 of FIG. 8, since the current flowing to the FETs 27, 41, and 51 decreases in comparison with that in the reference signal generation circuit 130 of FIG. 5, the dynamic range of the reference signal generation circuit 130 and hence the dynamic range of the reference signal can be secured.

Incidentally, the on resistance Rsw has an influence on both the reference signal VR of the expression (1) and the step voltage (variation amount) $\Delta VR$ of the reference signal of the expression (2).

The on resistance Rsw depends upon the PVT (Process, Voltage and Temperature). Therefore, the reference signal VR of the expression (1) and the step voltage (variation amount) $\Delta VR$ of the reference signal of the expression (2) disperse relying upon the PVT, and also a pixel value obtained by AD conversion performed using such a reference signal as just described suffers from a dispersion, and hence, the picture quality of an image obtained by the image pickup device is deteriorated.

Here, in the image pickup device (FIG. 1), as described hereinabove with reference to FIGS. 3 and 4, CDS is performed by which the difference between a reset level AD value (AD conversion result of the reset level) and a signal level AD value (AD conversion result of the signal level) is determined as a pixel value.

Accordingly, even if the reference signal VR itself is influenced by the on resistance Rsw, if the step voltage $\Delta VR$ of the reference signal is not influenced by the on resistance Rsw, then a pixel value obtained as a result of the CDS does not suffer from dispersion arising from the on resistance Rsw.

<Third Example of Configuration of Reference Signal Generation Circuit 130>

FIG. 9 is a circuit diagram depicting a third example of a configuration of the reference signal generation circuit 130 of FIG. 2.

It is to be noted that, in FIG. 9, portions corresponding to those of FIG. 8 are denoted by the same reference symbols, and in the following description, description of them is omitted suitably.

Referring to FIG. 9, the reference signal generation circuit 130 includes an operational amplifier 21, FETs 22 to 25, a gain controlling DAC 26, an FET 27, a counter 28, a ramp generation DAC 29, an output terminal 30, a termination unit 70, and an input resistor RI.

Accordingly, in FIG. 9, the reference signal generation circuit 130 is common to that of FIG. 8 in that it includes the components from the operational amplifier 21 to the output terminal 30, and the input resistor RI.

However, the reference signal generation circuit 130 of FIG. 9 is different from that of FIG. 8 in that it includes the termination unit 70 in place of the termination unit 60.

The termination unit 70 includes a plurality of terminating resistors RO, and switches 61 and 62, whose numbers are equal to the number of the plurality of terminating resistors RO.

Accordingly, the termination unit 70 is common to the termination unit 60 of FIG. 8 in that it includes a plurality (set) of terminating resistors RO and switches 61.

However, the termination unit 70 is different from the termination unit 60 of FIG. 8 in that the switches 62 are provided newly.

The termination unit 70 is configured such that current of the FETs 51 that are not connected to the output terminal 30 from among the FETs 51 configuring the ramp generation DAC 29 and serving as a plurality of current sources is supplied to the switches 61.

In particular, in FIG. 9, the terminal #0 of the switches 52 is connected not to the ground GND but to switches 62.

Further, in FIG. 9, in the termination unit 70, the switches 62 are connected to the terminal #0 of the switches 52 configuring the ramp generation DAC 29 and to each connection point between a terminating resistor RO and a switch 61.

Accordingly, the switches 62 switch on/off the connection between the FETs 51 connected to the switches 52 by which the terminal #0 is selected, namely, the FETs 51 serving as current sources that are not connected to the output terminal 30, and the connection points between the terminating resistors RO and the switches 61.

Each switch 62 is switched on/off in accordance with the gain controlling signal #2 similarly to the switches 61. Accordingly, each switch 62 is switched on/off in synchronism with a switch 61.

In the reference signal generation circuit 130 configured in such a manner as described above, when a switch 61 in the termination unit 70 is switched on, a terminating resistor RO that is connected at one end thereof to the output terminal 30 is connected at the other end thereof to the ground GND through the switch 61 that is on similarly as in the case of the termination unit 60 of FIG. 8.

As a result, to the terminating resistors RO that are connected to the ground GND through the switches 61 having an on state, current of the FETs 51 connected to the output terminal 30 from among the FETs 51 of the ramp generation DAC 29, namely, of the FETs 51 connected to the switches 52 by which the terminal #1 is selected, flows.

Here, the sum of current flowing to the terminating resistors RO connected to the ground GND through the switches 61 that have an on state is equal to the sum (current i2) of current of the FETs 51 connected to the output terminal 30 (FETs 51 connected to the switches 52 by which the terminal #1 is selected).

Further, if attention is paid only to current of the FETs 51 connected to the output terminal 30, then the sum of the current flowing to the switches 61 that are in an on state is equal to the sum (current i2) of current of the FETs 51 connected to the output terminal 30.

On the other hand, in FIG. 9, current of the FETs 51 connected to the output terminal 30 from among the FETs 51 of the ramp generation DAC 29, namely, of the FETs 51 connected to the switches 52 by which the terminal #0 is selected, flows through the switches 62 that are in an on state, to the switches 61, which are in an on state in synchronism with the switches 62 to the ground GND.

Here, if attention is paid only to current of the FETs 51 that are not connected to the output terminal 30 (FETs 51 connected to the switches 52 by which the terminal #0 is selected), then the sum of current flowing to the switches 61 that are in an on state is equal to the sum of current of the FETs 51 that are not connected to the output terminal 30.

As described above, if attention is paid only to current of the FETs 51 connected to the output terminal 30, then the sum of current flowing to the switches 61 that are in an on state is equal to the sum of current of the FETs 51 connected to the output terminal 30 (current i2). Further, if attention is paid only to current of the FETs 51 that are not connected to the output terminal 30, then the sum of current flowing to the switches 61 that are in an on state is equal to the sum of current of the FETs 51 that are not connected to the output terminal 30.

Accordingly, the sum of current flowing to the switches 61 that are in an on state is equal to the sum of current to all of the plurality of FETs 51 configuring the ramp generation DAC 29 and is fixed. As a result, the voltage drop caused by the switches 61 that are in an on state is fixed irrespective of the number $N_{RM}$ of the FETs 51 connected to the output terminal 30 (number of the FETs 51 connected to the switches 52 by which the terminal #1 is selected).

Here, adjustment of the analog gain of the reference signal generation circuit 130 of FIG. 9 and operation for generation of a reference signal having a P-phase slope and a D-phase slope along which the voltage (level) decreases at a fixed rate are similar to those in the case of FIG. 8, and therefore, description of them is omitted.

Since, in the reference signal generation circuit 130 of FIG. 9, the sum of current flowing to the switches 61 that are in an on state is normally equal to the sum of current through all of the plurality of FETs 51 configuring the ramp generation DAC 29, the reference signal VR outputted from the output terminal 30 can be represented by an expression (4).

$$VR = (BGR/RI)*MR1*(MR2*N_{GA})*MR3* \\ (N_{RMP}*RO + N_{RMP,all}*Rsw)/N_{RO} \quad (4)$$

$N_{RMP,all}$ represents the total number of the FETs 51 configuring the ramp generation DAC 29.

The step voltage of the reference signal VR represented by the expression (4), namely, the step voltage $\Delta VR$ of the reference signal VR when one switch 52 is switched can be represented by an expression (5).

$$\Delta VR = \{(BGR/RI)*MR1*(MR2*N_{GA})*MR3* \\ ((N_{RMP}+1)*RO + N_{RMP,all}*Rsw)/N_{RO}\} - \{(BGR/RI)*MR1*(MR2*N_{GA})*MR3*(N_{RMP}*RO + N_{RMP,all}*Rsw)/N_{RO}\} = (BGR/RI)* \\ MR1*MR2*N_{GA}*MR3*RO/N_{RO} \quad (5)$$

Meanwhile, the analog gain GA of the reference signal generation circuit 130 of FIG. 9 can be represented by an expression (6) similar to the expression (3).

$$GA = (N_{GA,0dB}/N_{GA})*(N_{RO}/N_{RO,0dB}) \quad (6)$$

Accordingly, in the reference signal generation circuit 130 of FIG. 9, the difference in current (current variation width) flowing to the FETs 27, 41, and 51 can be suppressed by $N_{RO}/N_{RO,0dB}$ of the expression (6) between the current when the analog gain is in the maximum and the current when the analog gain is in the minimum similarly as in the case of FIG. 8. As a result, the dynamic range of the reference signal generation circuit 130, and hence, the dynamic range of the reference signal, can be secured.

Further, in the reference signal generation circuit 130 of FIG. 9, although the on resistance Rsw has an influence on the reference signal VR of the expression (4), the on resistance Rsw does not have an influence on the step voltage $\Delta VR$ of the reference signal of the expression (5).

As described above, in the reference signal generation circuit 130 of FIG. 9, since the on resistance Rsw does not have an influence on the step voltage $\Delta VR$ of the reference signal, a pixel value obtained as a result of the CDS is not dispersed arising from the on resistance Rsw. Accordingly, deterioration of the picture quality of an image obtained by the image pickup device arising from that the on resistance Rsw disperses depending upon the PVT can be prevented.

It is to be noted that each switch 61 can be configured, for example, from an NMOS FET as described hereinabove. Switching on of an FET as the switch 61 can be performed by applying, for example, the power supply voltage VDD to the gate of the FET. In this case, when the FET switches on as the switch 61, the gate-source voltage of the FET is kept fixed and does not vary depending upon the magnitude of the voltage of the reference signal. Accordingly, the on resistance Rsw of the FET as the switch 61 does not vary depending upon the magnitude of the reference signal.

From the foregoing, although (the voltage of) the reference signal VR of the expression (4) is influenced by the on resistance Rsw, the on resistance Rsw does not vary depending upon the magnitude of the voltage of the reference signal VR.

Accordingly, the reference signal generation circuit 130 of FIG. 9 can prevent the linearity of the reference signal VR (that the slope varies at a fixed rate) from being damaged by a variation of the on resistance Rsw by the magnitude of the voltage of the reference signal VR. In other words, the linearity of the reference signal VR can be assured. This similarly applies also to the reference signal generation circuit 130 of FIG. 8.

<Fourth Example of Configuration of Reference Signal Generation Circuit 130>

Figure 10:
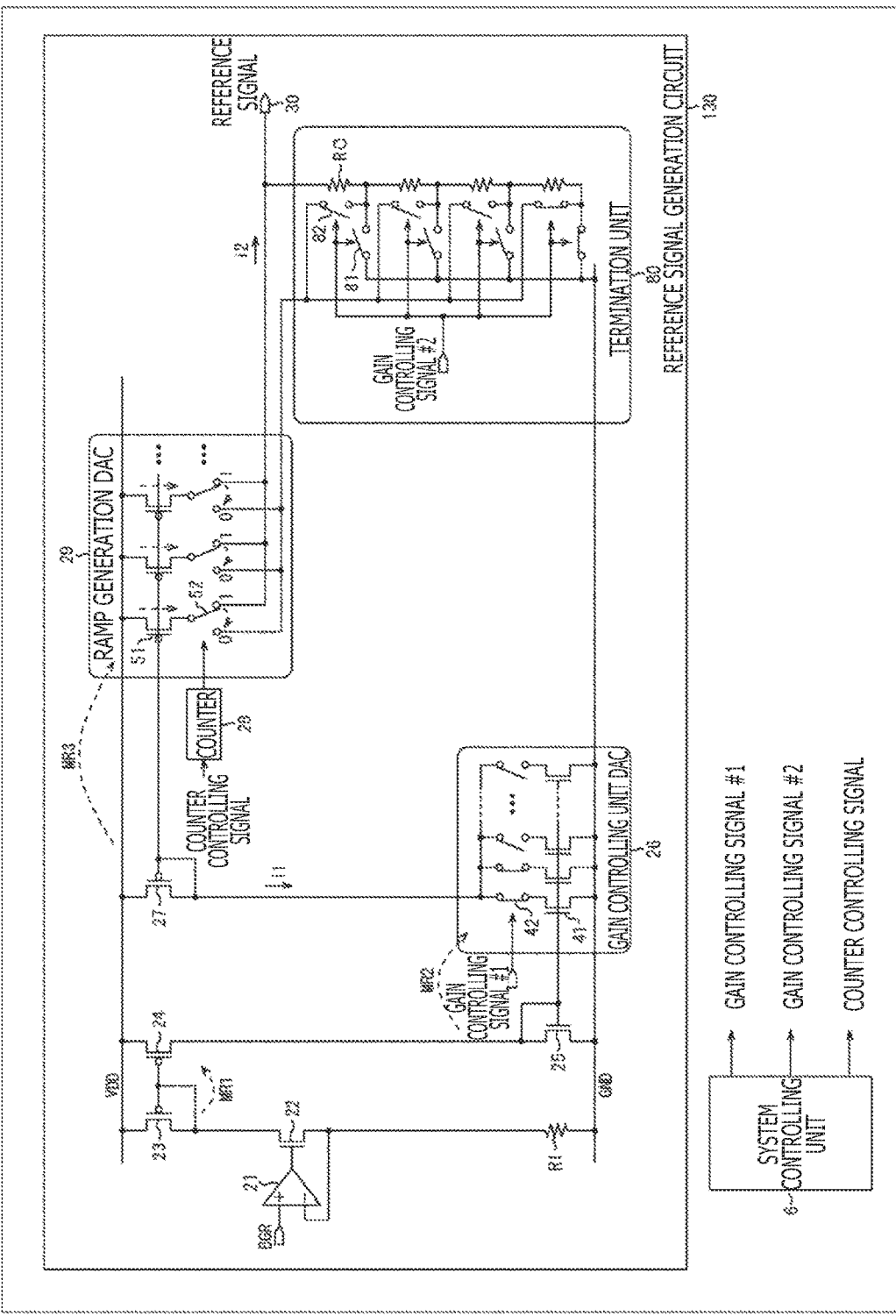
FIG. 10 is a circuit diagram depicting a fourth example of a configuration of the reference signal generation circuit 130.

FIG. 10 is a circuit diagram depicting a fourth example of a configuration of the reference signal generation circuit 130 of FIG. 2.

It is to be noted that, in FIG. 10, portions corresponding to those of FIG. 9 are denoted by the same reference symbols, and in the following description, description of them is omitted suitably.

Referring to FIG. 10, the reference signal generation circuit 130 includes an operational amplifier 21, FETs 22 to 25, a gain controlling DAC 26, an FET 27, a counter 28, a ramp generation DAC 29, an output terminal 30, a termination unit 80, and an input resistor RI.

Accordingly, in FIG. 10, the reference signal generation circuit 130 is common to that of FIG. 9 in that it includes the components from the operational amplifier 21 to the output terminal 30, and the input resistor RI.

However, the reference signal generation circuit 130 of FIG. 10 is different from that of FIG. 9 in that it includes the termination unit 80 in place of the termination unit 60.

The termination unit 80 includes a plurality of terminating resistors RO, and switches 81 and 82, whose numbers are equal to the number of the plurality of terminating resistors RO.

Here in FIG. 10, in order to simplify the description, the termination unit 80 has, for example, four terminating resistors RO as the plurality of terminating resistors RO. It is to be noted that the number of terminating resistors RO is not limited to four.

As described above, in FIG. 10, since the termination unit 80 has the four terminating resistors RO, it includes four switches 81 and 82 the number of which is equal to the number of terminating resistors RO.

In the termination unit 80, the four terminating resistors RO as the plurality of terminating resistors RO are connected in series. Further, the four terminating resistors RO connected in series are connected at one end thereof to the output terminal 30 and at the other end thereof to the ground GND.

Here, in the termination unit 80, each of the terminating resistors RO forms a set together with a switch 81 and a switch 82.

In the following description, the terminating resistor RO that is ith in a direction from the output terminal 30 toward the ground GND from among the four terminating resistors RO connected in series in the termination unit 80 is referred to merely as ith terminating resistor RO. Further, switches 81 and 82 that form a set together with the ith terminating resistor RO are individually referred to also as ith switches 81 and 82.

The ith switch 81 switches on/off the connection between one end of the ith terminating resistor RO on the ground GND side and the ground GND in accordance with a gain controlling signal #2 from the system controlling unit 6.

The ith switch 82 switches on/off the connection between the connection point between the ith terminating resistor RO and the switch 81 and the terminal #0 of the switch 52 configuring the ramp generation DAC 29 in accordance with a gain controlling signal #2 from the system controlling unit 6.

Here, the switches 81 and 82 that form a set with the terminating resistor RO are switched on/off in synchronism with each other in accordance with the gain controlling signal #2.

Further, among the switches 81 and 82 of the four sets as the plurality of sets, only the switches 81 and 82 of one set are switched on while the switches 81 and 82 of the other sets are switched off in accordance with the gain controlling signal #2.

In the reference signal generation circuit 130 configured in such a manner as described above, if (only) the ith switches 81 and 82 are switched on in the termination unit 80, then the sum of current supplied from the FETs 51 connected to the switches 52 by which the terminal #1 is selected (FETs 51 connected to the output terminal 30) flows through the first to ith terminating resistors RO and the ith switch 81 to the ground GND.

In the reference signal generation circuit 130 of FIG. 10, the voltage drop caused by the first to ith terminating resistors RO and the ith switch 81 is outputted as a reference signal from the output terminal 30. Accordingly, as the switches 81 and 82 of a set nearer to the output terminal 30 are switched on, the inclination (of the slope) of the reference signal outputted from the output terminal 30 decreases and the analog gain increases.

From the foregoing, the reference signal generation circuit 130 can perform adjustment of the analog gain by switching on only the switches 81 and 82 of one set from among the switches 81 and 82 of the four sets as the plurality of sets.

Here, if (only) the ith switches 81 and 82 in the termination unit 80 is switched on, then the sum (current i2) of current supplied from the FETs 51 connected to the switches 52 by which the terminal #1 is selected (FETs 51 connected to the output terminal 30) flows through the first to ith terminating resistors RO and the ith switch 81 to the ground GND.

Accordingly, if attention is paid only to the current of the FETs 51 connected to the output terminal 30, then the sum of current flowing to the ith switch 81 that is in an on state is equal to the sum (current i2) of current of the FETs 51 connected to the output terminal 30.

On the other hand, in FIG. 10, current of the FETs 51 not connected to the output terminal 30 from among the FETs 51 of the ramp generation DAC 29, namely, of the FETs 51 connected to the switches 52 by which the terminal #0 is selected flows through the ith switch 82 that is in an on state to the ith switch 81 that is on in synchronism with the switch 82 and then flows into the ground GND.

Accordingly, if attention is paid only to the FETs 51 not connected to the output terminal 30 (FETs 51 connected to the switches 52 by which the terminal #0 is selected), then the sum of current flowing to the ith switch 81 that is in an on state is equal to the sum of current of the FETs 51 that are not connected to the output terminal 30.

As described above, if attention is paid only to the current of the FETs 51 connected to the output terminal 30, then the sum of current flowing to the ith switch 81 that is in an on state is equal to the sum (current i2) of the FETs 51 connected to the output terminal 30. Further, if attention is paid only to the current of the FETs 51 not connected to the output terminal 30, then the sum of current flowing to the ith switch 81 that is in an on state is equal to the sum of current of the FETs 51 that are not connected to the output terminal 30.

Accordingly, the sum of current flowing to the ith switch 81 that is in an on state is normally equal to the sum of current of all of the plurality of FETs 51 that configure the ramp generation DAC 29 and is fixed. As a result, the voltage drop caused by the ith switch 81 that is in an on state is fixed irrespective of the number $N_{RM}$ of FETs 51 connected to the output terminal 30 (number of FETs 51 connected to the switches 52 by which the terminal #1 is selected).

Here, operation of the reference signal generation circuit 130 of FIG. 10 for generation of a reference signal having a P-phase slope and a D-phase slope along which the voltage (level) decreases at a fixed rate is similar to that in the case of FIG. 8, and therefore, description of the operation is omitted.

Since, in the reference signal generation circuit 130 of FIG. 10, the sum of current flowing to the switches 81 that are in an on state is normally equal to the sum of current of all of the plurality of FETs 51 configuring the ramp generation DAC 29, the reference signal VR outputted from the output terminal 30 can be represented by an expression (7).

$$VR = (BGR/RI)*MR1*(MR2*N_{GA})*MR3* \\ (N_{RMP}*RO*N_{RO}'+N_{RMP,all}*Rsw) \quad (7)$$

$N_{RO}'$ represents what numbered switch the switch 81 (and 82) that is in an on state under the control of the gain controlling signal #2 is, namely, the number of terminating resistors RO through which the current i2 of the ramp generation DAC 29 flows.

The step voltage of the reference signal VR represented by the expression (7), namely, the step voltage $\Delta VR$ of the reference signal VR when one switch 52 is witched, can be represented by an expression (8).

$$\Delta VR = \{(BGR/RI)*MR1*(MR2*N_{GA})*MR3* \\ ((N_{RMP}+1)*RO*N_{RO}'+N_{RMP,all}*RSW)\} - \{(BGR/RI)*MR1*(MR2*N_{GA})*MR3*(N_{RMP}*RO*N_{RO}'+ \\ N_{RMP,all}*Rsw)\} = (BGR/RI)* \\ MR1*MR2*N_{GA}*MR3*RO*N_{RO} \quad (8)$$

Meanwhile, the analog gain GA of the reference signal generation circuit 130 of FIG. 10 can be represented by an expression (9).

$$GA = (N_{GA,0dB}/N_{GA})*(N_{RO}'/N_{RO,0dB}) \quad (9)$$

Accordingly, the reference signal generation circuit 130 of FIG. 10 can suppress the difference in current flowing to the FETs 27, 41, and 51 by the amount of $N_{RO}'/N_{RO,0dB}$ of the expression (9) between the current when the analog gain is in the maximum and the current when the analog gain is in the minimum. As a result, the dynamic range of the reference signal generation circuit 130, and hence the dynamic range of the reference signal, can be secured.

Further, in the reference signal generation circuit 130 of FIG. 10, although the on resistance Rsw has an influence on the reference signal VR of the expression (7), the on resistance Rsw does not have an influence on the step voltage $\Delta VR$ of the reference signal of the expression (8).

As described above, in the reference signal generation circuit 130 of FIG. 10, since the on resistance Rsw does not have an influence on the step voltage $\Delta VR$ of the reference signal, a pixel value obtained as a result of the CDS does not suffer from a dispersion arising from the on resistance Rsw. Accordingly, deterioration of the picture quality of an image obtained by the image pickup device arising from that the on resistance Rsw disperses depending upon the PVT can be prevented.

<Fifth Example of Configuration of Reference Signal Generation Circuit 130>

FIG. 111 is a circuit diagram depicting a fifth example of a configuration of the reference signal generation circuit 130 of FIG. 2.

It is to be noted that, in FIG. 11, portions corresponding to those of FIG. 10 are denoted by the same reference symbols, and in the following description, description of them is omitted suitably.

Figure 11:
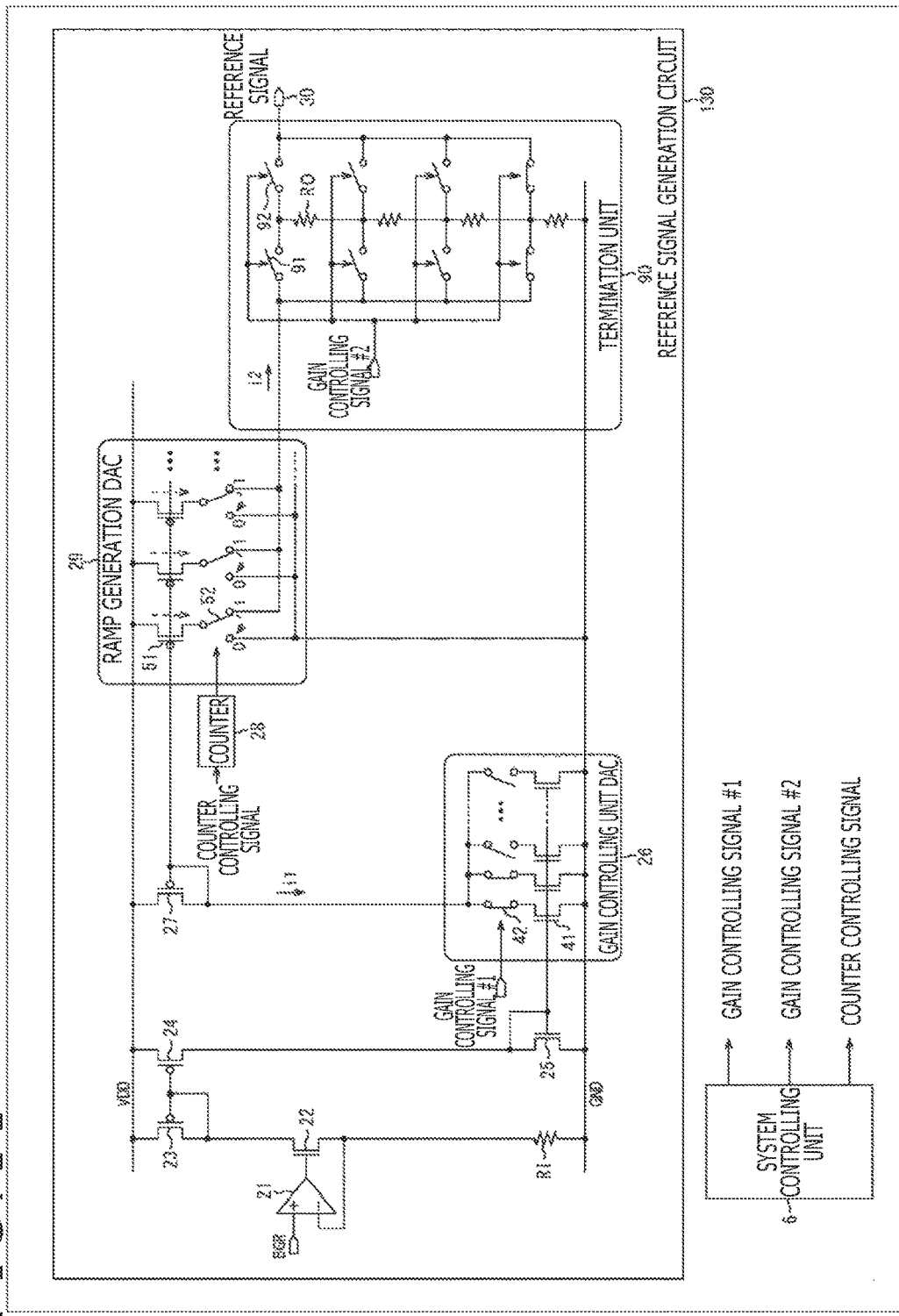
FIG. 11 is a circuit diagram depicting a fifth example of a configuration of the reference signal generation circuit 130.

Referring to FIG. 11, the reference signal generation circuit 130 includes an operational amplifier 21, FETs 22 to 25, a gain controlling DAC 26, an FET 27, a counter 28, a ramp generation DAC 29, an output terminal 30, a termination unit 90, and an input resistor RI.

Accordingly, in FIG. 11, the reference signal generation circuit 130 is common to that of FIG. 10 in that it includes the components from the operational amplifier 21 to the output terminal 30, and the input resistor RI.

However, the reference signal generation circuit 130 of FIG. 11 is different from that of FIG. 10 in that it includes the termination unit 90 in place of the termination unit 60.

Further, in FIG. 11, the switches 52 configuring the ramp generation DAC 29 are different from those in the case of FIG. 10 in which the terminal #0 is connected to the switches 82 in that the terminal #0 is connected to the ground GND similarly as in the cases of FIGS. 5 and 8.

The termination unit 90 includes a plurality of terminating resistors RO, and switches 91 and 92, whose numbers are equal to the number of the plurality of terminating resistors RO.

Here in FIG. 11, in order to simplify the description, the termination unit 90 has, for example, four terminating resistors RO as the plurality of terminating resistors RO similarly as in FIG. 10. It is to be noted that the number of terminating resistors RO is not limited to four.

As described above, in FIG. 11, since the termination unit 90 has the four terminating resistors RO, it includes four switches 91 and 92 the number of which is equal to the number of terminating resistors RO.

In the termination unit 90, the four terminating resistors RO as the plurality of terminating resistors RO are connected in series, and the four terminating resistors RO connected in series are connected at one end thereof to the ground GND.

Here, in the termination unit 90, each of the terminating resistors RO forms a set together with a switch 91 and a switch 92.

In the following description, the terminating resistor RO that is ith in a direction toward the ground GND from among the four terminating resistors RO connected in series in the termination unit 90 is referred to merely as ith terminating resistor RO. Further, a switch 91 and a switch 92 that form a set together with the ith terminating resistor RO are individually referred to also as ith switches 91 and 92.

The ith switches 91 and 92 are connected in series and switch on/off in synchronism with each other in accordance with a gain controlling signal #2 from the system controlling unit 6.

The ith switches 91 and 92 connected in series are connected at one end thereof to the terminal #1 of a switch 52 configuring the ramp generation DAC 29 and at the other end thereof to the output terminal 30.

Further, a connection point between the ith switches 91 and 92 connected in series is connected to one of the opposite ends of the ith terminating resistor RO, which is a farther end from the ground GND.

Here, among the switches 91 and 92 of the four sets as the plurality of sets, only the switches 91 and 92 of one set are switched on while the switches 91 and 92 of the other sets are switched off in accordance with the gain controlling signal #2.

In the reference signal generation circuit 130 configured in such a manner as described above, if (only) the ith switches 91 and 92 are switched on in the termination unit 90, then current i2 of the ramp generation DAC 29, namely, the sum of current supplied from the FETs 51 connected to the switches 52 by which the terminal #1 is selected (FETs 51 connected to the output terminal 30) flows through the ith switch 91 and the ith to fourth terminating resistors RO and then flows into the ground GND.

In the reference signal generation circuit 130 of FIG. 11, the voltage drop caused by the ith to fourth 4-$i$+1 terminating resistors RO is outputted as a reference signal from the output terminal 30. Accordingly, as the switches 91 and 92 of a set nearer to the output terminal 30 are switched on, the inclination (of the slope) of the reference signal outputted from the output terminal 30 increases and the analog gain decreases.

From the foregoing, the reference signal generation circuit 130 in FIG. 11 can perform adjustment of the analog gain by switching on only the switches 91 and 92 of one set from among the switches 91 and 92 of the four sets as the plurality of sets.

Further, in the reference signal generation circuit 130 of FIG. 11, since the voltage drop caused by the ith to fourth 4-$i$+1 terminating resistors RO is outputted as a reference signal from the output terminal 30 as described above, the reference signal is not influenced by the on resistance Rsw of the switches 91 or 92.

Accordingly, since the on resistance Rsw does not have an influence on the step voltage of the reference signal (variation amount (of the voltage) of the reference signal when one switch 52 is switched) either, a pixel value obtained as a result of the CDS does not suffer from a dispersion arising from the on resistance Rsw. As a result, deterioration of the picture quality of an image obtained by the image pickup device arising from that the on resistance Rsw disperses depending upon the PVT can be prevented.

Further, in the reference signal generation circuit 130 of FIG. 11, the difference in current flowing to the FETs 27, 41, and 51 between the current when the analog gain is in the maximum and the current when the analog gain is in the minimum can be suppressed similarly as in the cases of FIGS. 8 to 10. As a result, the dynamic range of the reference signal generation circuit 130, and hence the dynamic range of the reference signal, can be secured.

It is to be noted that operation of the reference signal generation circuit 130 of FIG. 11 for generation of a reference signal having a P-phase slope and a D-phase slope along which the voltage (level) decreases at a fixed rate is similar to that in the case of FIG. 8, and therefore, description of the operation is omitted.

<Example of Use of Image Pickup Device>

Figure 12:
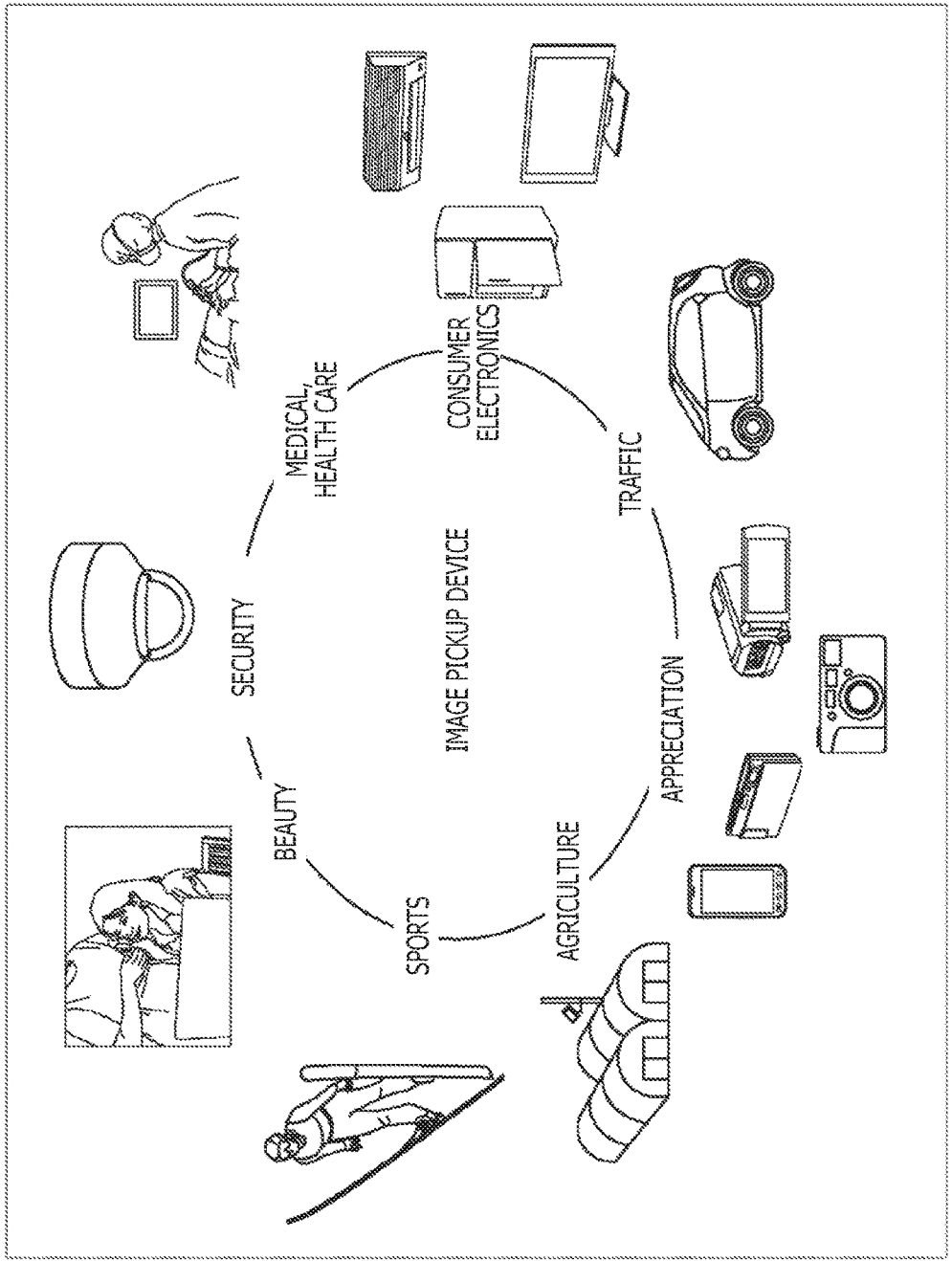
FIG. 12 is a view depicting an example of used when the image pickup device is used.

FIG. 12 is a view depicting an example of use in which the image pickup device of FIG. 1 is used.

The image pickup device described hereinabove can be used, for example, in various electronic apparatus in which light such as visible rays, infrared rays, ultraviolet rays, and X rays is sensed as described below.

- Electronic apparatus by which an image that is provided for viewing is picked up such as a digital camera or a portable apparatus with a camera function
- Electronic apparatus provided for traffic such as automotive sensors for image pickup of the front, the rear, the surroundings, the inside and so forth of an automobile for safe driving such as automatic stopping, recognition of a state of the driver and so forth, a security camera for monitoring a traveling vehicle or the road, a distance measurement sensor for measuring the distance between vehicles and so forth
- Electronic apparatus provided for consumer electronics such as a TV, a refrigerator, or an air conditioner for picking up an image of a gesture of a user to perform apparatus operation in accordance with the gesture
- Electronic apparatus provided for medical or health care use such as an endoscope, an electronic microscope, or an apparatus that performs angiography by reception of infrared rays
- Electronic apparatus provided for use for security such as a surveillance camera for security use or a camera for people authentication purpose
- Electronic apparatus for use for beauty such as a skin measuring instrument for picking up an image of the skin or a microscope for picking up an image of the scalp
- Electronic apparatus provided for use for sports such as an action camera or a wearable camera for sports applications and so forth
- Electronic apparatus provided for agricultural use such a camera for monitoring the state of a field or crops <Digital Camera to which Image Pickup Device is Applied>

Figure 13:
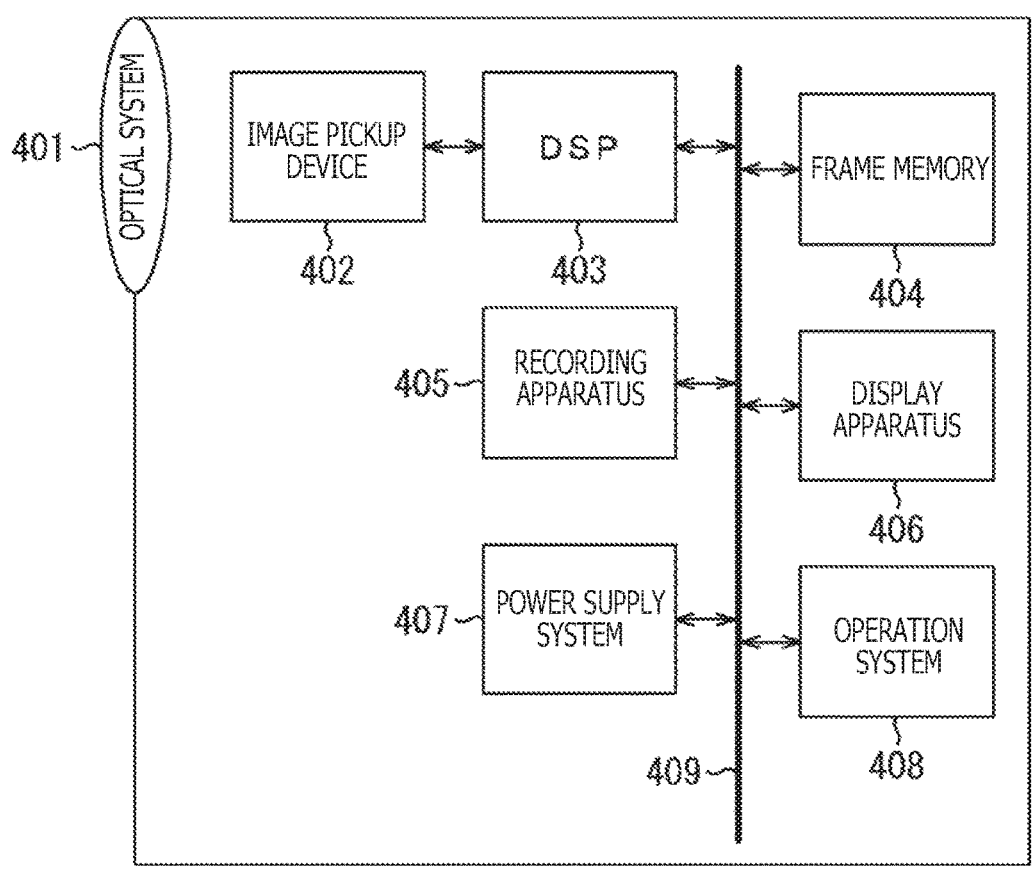
FIG. 13 is a block diagram depicting an example of a configuration of one embodiment of a digital camera that is one of electronic apparatus to which the image pickup device is applied.

FIG. 13 is a block diagram depicting an example of a configuration of an embodiment of a digital camera that is one of electronic apparatus to which the image pickup device of FIG. 1 is applied.

The digital camera can pick up an image of both a still picture and a moving picture.

Referring to FIG. 13, the digital camera includes an optical system 401, an image pickup device 402, a DSP (Digital Signal Processor) 403, a frame memory 404, a recording apparatus 405, a display apparatus 406, a power supply system 407, an operation system 408, and a bus line 409. In the digital camera, the components from the DSP 403 to the operation system 408 are connected to each other through the bus line 409.

The optical system 401 collects light from the outside on the image pickup device 402.

The image pickup device 402 is configured similarly to the image pickup device of FIG. 1, and receives and photoelectrically convers light from the optical system 401, and outputs image data as an electric signal.

The DSP 403 performs signal processing necessary for image data outputted from the image pickup device 402.

The frame memory 404 temporarily stores image data, for which the signal processing has been performed by the DSP 403, in a unit of a frame.

The recording apparatus 405 records image data of a still picture or a moving picture picked up by the image pickup device 402 into a recording medium such as a semiconductor memory or a hard disk.

The display apparatus 406 is configured from a panel type display apparatus such as, for example, a liquid crystal panel or an organic EL (Electro Luminescence) panel or the like and displays an image (moving picture or still picture) corresponding to image data stored in the frame memory 404.

The power supply system 407 supplies necessary power to the components from the image pickup device 402 to the display apparatus 406 and the operation system 408.

The operation system 408 outputs an operation instruction for various functions the digital camera has in accordance with an instruction by the user.

It is to be noted that the embodiment of the present technology is not limited to the embodiment described above and various changes can be made without departing from the subject matter of the present technology.

In particular, the present technology can be applied to an image pickup device that adopts, in addition to column AD conversion by which AD conversion of a pixel signal of a pixel 110 simultaneously for all columns, area AD conversion by which, for example, the pixels 110 are separated into a plurality of areas and AD conversion of an image signal of a pixel 110 is performed simultaneously for the all areas.

Further, the advantageous effects described in the present specification are only examples and not limitative of the present technology, and there may be some other advantageous.

It is to be noted that the present technology can have the following configurations.

<1>
An image pickup device including:
a pixel having a photoelectric conversion device that performs photoelectric conversion and configured to output an electric signal;
a reference signal generation unit configured to generate a reference signal having a level that varies;
a comparison unit configured to compare the electric signal and the reference signal with each other; and
a counting unit configured to perform AD (Analog to Digital) conversion of the electric signal by performing counting of a count value in response to a result of the comparison between the electric signal and the reference signal, in which
the reference signal generation unit includes
a plurality of current sources whose connection to an output terminal for outputting the reference signal is selectable,
a plurality of terminating resistors connected to the output terminal, and
a plurality of switches configured to select the terminating resistors that are to supply current of the current sources that are connected to the output terminal, and
the reference signal generation unit is configured so as to supply current of the current sources that are not connected to the output terminal to the switches.

<2>
The image pickup device according to <1>, in which
the switches are connected in series to the terminating resistors, and,
when any of the switches is switched on, current of the current source connected to the output terminal flows through the terminating resistor connected to the switch.

<3>
The image pickup device according to <2>, in which
current of the current sources that are not connected to the output terminal is supplied to the switches connected to the terminating resistors to which current of the current sources connected to the output terminal flows.

<4>
The image pickup device according to <2> or <3>, further including:
a different switch configured to switch on/off connection of the current sources that are not connected to the output terminal to a connection point between the terminating resistors and the switches;
the different switch being switched on/off in synchronism with the switches.

<5>
The image pickup device according to any one of <1> to <4>, in which,
as the number of the current sources connected to the output terminal increases or decreases, the level outputted from the output terminal varies.

<6>
An electronic apparatus including:
an optical system configured to collect light; and
an image pickup device configured to receive the light to pick up an image, in which
the image pickup device includes
a pixel having a photoelectric conversion device that performs photoelectric conversion and configured to output an electric signal,
a reference signal generation unit configured to generate a reference signal having a level that varies,
a comparison unit configured to compare the electric signal and the reference signal with each other, and
a counting unit configured to perform AD (Analog to Digital) conversion of the electric signal by performing counting of a count value in response to a result of the comparison between the electric signal and the reference signal,
the reference signal generation unit includes
a plurality of current sources whose connection to an output terminal for outputting the reference signal is selectable,
a plurality of terminating resistors connected to the output terminal, and
a plurality of switches configured to select the terminating resistors that are to supply current of the current sources that are connected to the output terminal, and
the reference signal generation unit is configured so as to supply current of the current sources that are not connected to the output terminal to the switches.

REFERENCE SIGNS LIST

1 Semiconductor substrate, 2 Pixel array unit, 3 Row scanning unit, 4 Column signal processing unit, 5 Column scanning unit, 6 System controlling unit, 7 Pixel driving line, 8 VSL, 9 Transfer line, 10 Output terminal, 21 Operational amplifier, 22 to 25 FET, 26 Gain controlling DAC, 27 FET, 28 Counter, 29 Ramp generation DAC, 30 Output terminal, 41 FET, 42 Switch, 51 FET, 52 Switch, 60 Termination unit, 61, 62 Switch, 70 Termination unit, 80 Termination unit, 81, 82 Switch, 90 Termination unit, 91, 92 Switch, 101 to 105 FET, 106 FD, 110 Pixel, 120 Bias circuit, 130 Reference signal generation circuit, 131 Reference clock generation circuit, 140 Comparator, 141, 142 Capacitor, 150 Counter, 401 Optical system, 402 Image pickup device, 403 DSP, 404 Frame memory, 405 Recording apparatus, 406 Display apparatus, 407 Power supply system, 408 Operation system, 409 Bus line

The invention claimed is:

1. An image pickup device, comprising:
   a pixel having a photoelectric conversion device that performs photoelectric conversion and configured to output an electric signal;
   a reference signal generation unit configured to generate a reference signal having a level that varies;
   a comparison unit configured to compare the electric signal and the reference signal with each other; and
   a counting unit configured to perform AD (Analog to Digital) conversion of the electric signal by performing counting of a count value in response to a result of the comparison between the electric signal and the reference signal, wherein
   the reference signal generation unit includes:
      a plurality of current sources whose connection to an output terminal for outputting the reference signal is selectable,
      a plurality of terminating resistors connected to the output terminal, and
      a plurality of switches configured to select the plurality of terminating resistors that are to supply first current of a plurality of first current sources of the plurality of current sources that are connected to the output terminal, and
      the reference signal generation unit is further configured so as to supply second current of a plurality of second current sources of the plurality of current sources that are not connected to the output terminal to the plurality of switches.

2. The image pickup device according to claim 1, wherein
   the plurality of switches are connected in series to the plurality of terminating resistors, and
   when a switch of the plurality of switches is switched on, third current of a current source of the plurality of first current sources connected to the output terminal flows through a terminating resistor of the plurality of terminating resistors connected to the switch.

3. The image pickup device according to claim 2, wherein
   the second current of the plurality of second current sources that are not connected to the output terminal is supplied to the plurality of switches connected to the plurality of terminating resistors to which the first current of the plurality of first current sources connected to the output terminal flows.

4. The image pickup device according to claim 2, further comprising:
   a different switch configured to switch on/off connection of the plurality of second current sources that are not connected to the output terminal to a connection point between the plurality of terminating resistors and the plurality of switches; and
   the different switch being switched on/off in synchronism with the plurality of switches.

5. The image pickup device according to claim 1, wherein, as a number of the plurality of first current sources connected to the output terminal increases or decreases, the level outputted from the output terminal varies.

6. An electronic apparatus, comprising:
   an optical system configured to collect light; and
   an image pickup device configured to receive the light to pick up an image, wherein
   the image pickup device includes:
      a pixel having a photoelectric conversion device that performs photoelectric conversion and configured to output an electric signal,
      a reference signal generation unit configured to generate a reference signal having a level that varies,
      a comparison unit configured to compare the electric signal and the reference signal with each other, and
      a counting unit configured to perform AD (Analog to Digital) conversion of the electric signal by performing counting of a count value in response to a result of the comparison between the electric signal and the reference signal, wherein
      the reference signal generation unit includes
         a plurality of current sources whose connection to an output terminal for outputting the reference signal is selectable,
         a plurality of terminating resistors connected to the output terminal, and
         a plurality of switches configured to select the plurality of terminating resistors that are to supply first current of a plurality of first current sources of the plurality of current sources that are connected to the output terminal, and
      the reference signal generation unit is further configured so as to supply second current of a plurality of second current sources of the plurality of current sources that are not connected to the output terminal to the plurality of switches.

* * * * *